(12) United States Patent
Okuno

(10) Patent No.: US 10,205,053 B2
(45) Date of Patent: *Feb. 12, 2019

(54) SEMICONDUCTOR STRUCTURE AND SEMICONDUCTOR DEVICE

(71) Applicant: TOYODA GOSEI CO., LTD., Kiyosu-shi (JP)

(72) Inventor: Koji Okuno, Kiyosu (JP)

(73) Assignee: TOYODA GOSEI CO., LTD., Kiyosu-Shi, Aichi-Ken (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/837,970

(22) Filed: Dec. 11, 2017

(65) Prior Publication Data

US 2018/0182919 A1    Jun. 28, 2018

(30) Foreign Application Priority Data

Dec. 28, 2016   (JP) .................................. 2016-257145

(51) Int. Cl.

| H01L 29/06 | (2006.01) |
|---|---|
| H01L 31/00 | (2006.01) |
| H01L 33/12 | (2010.01) |
| H01L 33/38 | (2010.01) |
| H01L 33/06 | (2010.01) |
| H01L 33/20 | (2010.01) |

(Continued)

(52) U.S. Cl.
CPC .............. *H01L 33/12* (2013.01); *H01L 33/06* (2013.01); *H01L 33/20* (2013.01); *H01L 33/38* (2013.01); *H01L 33/007* (2013.01); *H01L 33/32* (2013.01); *H01L 2933/0016* (2013.01)

(58) Field of Classification Search
USPC .............................. 257/22, 23, 79–103, 918, 257/E51.018–E51.022, E33.001–E33.077, 257/E33.054, E25.028, E25.032
See application file for complete search history.

(56) References Cited

U.S. PATENT DOCUMENTS

| 5,959,355 A * | 9/1999 | Petit ................... H01L 23/49811 257/737 |
|---|---|---|
| 7,595,511 B2 | 9/2009 | Kang |

(Continued)

FOREIGN PATENT DOCUMENTS

| JP | H11-191658 A | 7/1999 |
|---|---|---|
| JP | 2000-031591 A | 1/2000 |

(Continued)

OTHER PUBLICATIONS

United States Notice of Allowance dated Sep. 28, 2018 in U.S. Appl. No. 15/847,630.

*Primary Examiner* — Niki H Nguyen
(74) *Attorney, Agent, or Firm* — McGinn IP Law Group, PLLC.

(57) ABSTRACT

There are provided a semiconductor structure exhibiting excellent crystallinity by preventing the occurrence of a strain, and a semiconductor device. The semiconductor structure comprises a substrate, a bridging portion bridged to the substrate, a semiconductor layer formed on the bridging portion, a void defined by the substrate and the bridging portion. The bridging portion has a plurality of through holes. The through holes are blocked with the semiconductor layer. Therefore, the semiconductor layer does not have a through hole.

20 Claims, 14 Drawing Sheets

(51) Int. Cl.
*H01L 33/00* (2010.01)
*H01L 33/32* (2010.01)

(56) References Cited

U.S. PATENT DOCUMENTS

| | | |
|---|---|---|
| 7,906,787 B2 | 3/2011 | Kang |
| 9,496,456 B2 | 11/2016 | Kumagai et al. |
| 2003/0052156 A1* | 3/2003 | Kim .................... B23K 1/0008 228/180.22 |
| 2006/0208273 A1 | 9/2006 | Kang |
| 2009/0309107 A1 | 12/2009 | Kang |
| 2010/0068466 A1* | 3/2010 | Nguyen ............... B23K 3/0623 428/172 |
| 2015/0228848 A1 | 8/2015 | Miyoshi et al. |
| 2016/0087145 A1 | 3/2016 | Kumagai et al. |
| 2018/0182689 A1* | 6/2018 | Okuno ................ H01L 23/4821 |

FOREIGN PATENT DOCUMENTS

| | | |
|---|---|---|
| JP | 2006-339534 A | 12/2006 |
| JP | 2007-027298 A | 2/2007 |
| JP | 2007-519214 A | 7/2007 |
| JP | 2015-153826 A | 8/2015 |
| JP | 2016-063128 A1 | 4/2016 |
| WO | WO 2005/015647 A1 | 2/2005 |

\* cited by examiner

SEMICONDUCTOR STRUCTURE AND SEMICONDUCTOR DEVICE

BACKGROUND OF THE INVENTION

Field of the Invention

The technique disclosed in the present specification relates to a semiconductor structure and a semiconductor device.

Background Art

In general, the production of a semiconductor device involves growth of a semiconductor layer on a growth substrate. In the case where the material of the growth substrate differs from that of the semiconductor layer, a strain or a lattice defect (due to a lattice mismatch) may occur at the interface between the growth substrate and the semiconductor layer. The occurrence of a strain may cause poor crystallinity of the semiconductor layer. The strain also causes an internal stress in the semiconductor layer. The internal stress in the semiconductor layer generates a piezoelectric field. The piezoelectric field affects the behavior of electrons in the semiconductor device. Therefore, desirably, the strain in the semiconductor layer is relaxed.

For example, Patent Document 1 discloses a technique for providing a superlattice layer and a layered structure of thin films, thereby relaxing an interfacial strain (see paragraphs [0017] and [0018] of Patent Document 1). This technique improves the crystallinity of the resultant semiconductor layer.

Patent Document 1: Japanese Patent Application Laid-Open (kokai) No. 2000-031591

However, the aforementioned technique cannot prevent occurrence of a strain at the interface between the growth substrate and the semiconductor layer. Thus, desirably, the occurrence of a strain is prevented, thereby growing a semiconductor layer exhibiting excellent crystallinity.

SUMMARY OF THE INVENTION

The technique disclosed in the present specification has been accomplished for solving problems involved in the aforementioned conventional technique. Accordingly, an object of the technique disclosed in the present specification is to provide a semiconductor structure exhibiting excellent crystallinity by preventing the occurrence of a strain. Another object of the technique is to provide a semiconductor device.

In a first aspect of the disclosure, there is provided a semiconductor structure comprising a substrate, a bridging portion bridged to the substrate, a semiconductor layer formed on the bridging portion, and a first void defined by the substrate and the bridging portion. The bridging portion has a plurality of through holes. The semiconductor layer does not have a through hole.

The semiconductor structure has a first void between the substrate and the bridging portion. The first void is a noncontact portion between the substrate and the bridging portion. In the noncontact portion, lattice mismatch itself does not occur between the substrate and the bridging portion. Therefore, a strain itself due to a lattice mismatch is suppressed from occurring.

In the present specification, there are provided a semiconductor structure exhibiting excellent crystallinity by preventing the occurrence of a strain, and a semiconductor device.

BRIEF DESCRIPTION OF THE DRAWINGS

Various other objects, features, and many of the attendant advantages of the present technique will be readily appreciated as the same becomes better understood with reference to the following detailed description of the preferred embodiments when considered in connection with the accompanying drawings, in which.

DETAILED DESCRIPTION OF PREFERRED EMBODIMENTS

Figure 1:
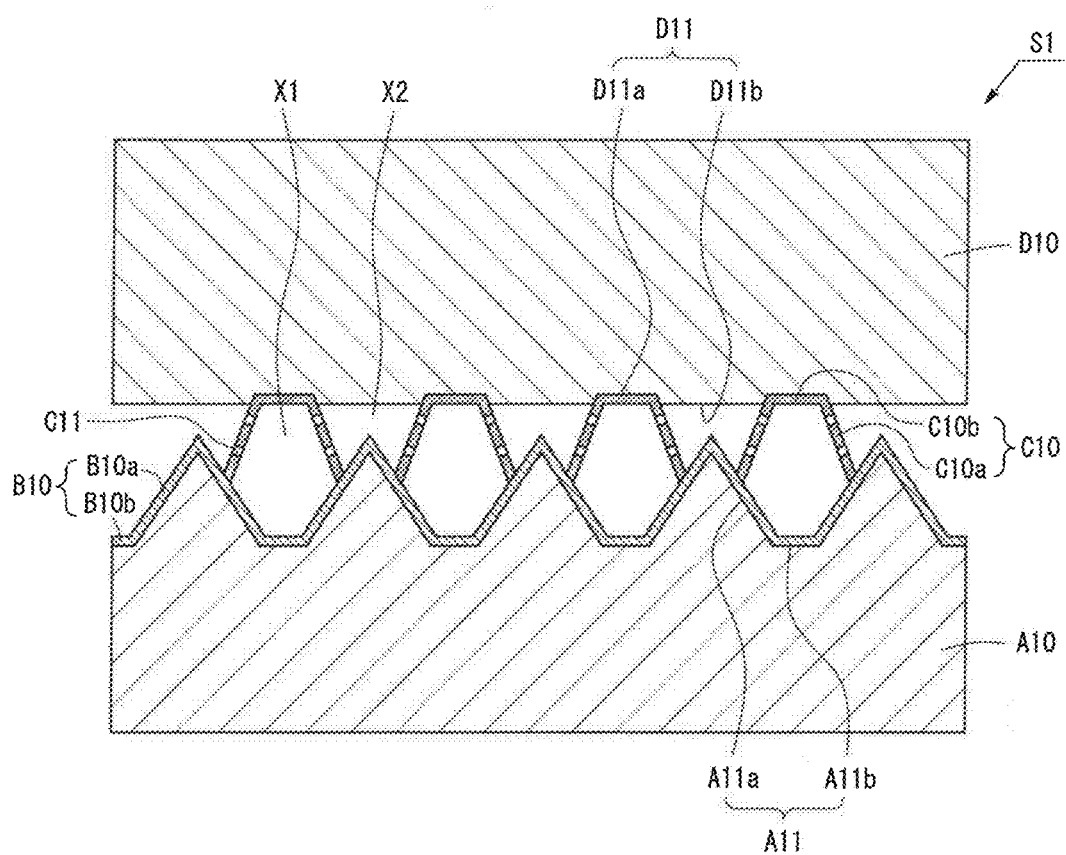
FIG. 1 schematically shows the configuration of a semiconductor structure of a first embodiment.

Specific embodiments will next be described with reference to the drawings by taking, as an example, a semiconductor structure and a semiconductor device. However, the technique disclosed in the present specification should not be limited to these embodiments. In the below-described semiconductor device, the layered structure of each layer and the structure of each electrode are shown for an exemplary purpose. Needless to say, the layered structure may differ from that described below in the embodiments. The thickness proportion of each layer which is schematically shown in the drawings does not correspond to its actual value.

First Embodiment

1. Semiconductor Structure

FIG. 1 schematically shows the configuration of a semiconductor structure S1 of a first embodiment. The semiconductor structure S1 is a substrate having a semiconductor layer formed thereon. That is, the semiconductor structure S1 is a type of substrate having an epitaxial layer formed thereon. Thus, the semiconductor structure S1 may be used as a self-standing substrate or a template substrate. As described in the embodiments hereinbelow, the semiconductor structure S1 includes a semiconductor device, such as a semiconductor light-emitting device or a power device.

FIG. 1 is a somewhat enlarged view of an unevenly shaped portion of the substrate and the structure of a portion around the unevenly shaped portion. The semiconductor structure S1 includes a substrate A10, a buffer layer B10, bridging portions C10, and a semiconductor layer D10. In FIG. 1, for example, the unevenly shaped portion of the substrate is enlargedly shown for the sake of easy understanding. The same shall apply to the other drawings described below.

The substrate A10 is an uneven substrate having an unevenly shaped portion A11. The unevenly shaped portion A11 has a plurality of protrusions A11a and a bottom portion A11b. The protrusions A11a extend from the bottom portion A11b toward the outside of the substrate A10. The protrusions A11a have a conical shape. Thus, each of the protrusions A11a has a side face inclined to the main surface of the substrate A10. The protrusions A11a are arranged in a honeycomb pattern with respect to the bottom portion A11b. The substrate A10 is formed of sapphire. The substrate A10 may be formed of a material other than sapphire; for example, SiC, Si, ZnO, GaN, AlN, MgAl$_2$O$_4$, or Ga$_2$O$_3$. The substrate A10 may be an amorphous substrate formed of, for example, glass.

The buffer layer B10 is provided for transferring the crystallinity of the substrate A10 to a layer grown above the buffer layer B10. The buffer layer B10 has sloped portions B10a and a bottom portion B10b. The buffer layer B10 has a very small thickness. Thus, the buffer layer B10 is formed so as to follow the shape of the unevenly shaped portion A11 of the substrate A10. The sloped portions B10a of the buffer layer B10 are formed at positions facing the protrusions A11a of the substrate A10. The bottom portion B10b of the buffer layer B10 is formed at a position facing the bottom portion A11b of the substrate A10. The buffer layer B10 is formed of AlN. The buffer layer B10 has a thickness of 1 nm to 100 nm. The buffer layer B10 may have a thickness other than that described above. When the difference in lattice constant is small between the substrate and the bridging portion, the formation of the buffer layer may be omitted.

The bridging portions C10 are bridged to the substrate A10. The bridging portions C10 are located between the substrate A10 and the semiconductor layer D10. Each of the bridging portions C10 has a leg portion C10a and a top portion C10b. The leg portion C10a is integrated with the top portion C10b. The leg portion C10a supports the top portion C10b and the semiconductor layer D10. The leg portion C10a is formed so as to extend from the protrusion A11a of the substrate A10. That is, the bridging portion C10 is bridged to the substrate A10 by means of the leg portion C10a. In this case, the bridging portion C10 is supported by the side face of the protrusion A11a of the substrate A10. At least a portion of the leg portion C10a is not in contact with the semiconductor layer D10. The top portion C10b has a flat surface. The top portion C10b is in direct contact with the semiconductor layer D10. The bridging portions C10 are formed of AlN.

The semiconductor layer D10 includes one or more semiconductor layers. The semiconductor layer D10 is formed on the top portions C10b of the bridging portions C10. The semiconductor layer D10 is in contact with a very small portion of the leg portion C10a of each bridging portion C10 and is in contact with the top portion C10b of the bridging portion C10. The semiconductor layer D10 has a surface D11 on the substrate A10 side, and the surface D11 has a first site D11a and a second site D11b. The first site D11a is in contact with the top portion C10b of each bridging portion C10. The second site D11b is not in contact with the bridging portion C10. The second site D11b slightly protrudes from the top portion C10b of the bridging portion C10 toward the substrate A10. The second site D11b faces the leg portion C10a of the bridging portion C10 and the protrusion A11 of the substrate A10.

2. Bridging Portion and Void 2-1. Shape of Bridging Portion

Figure 2:
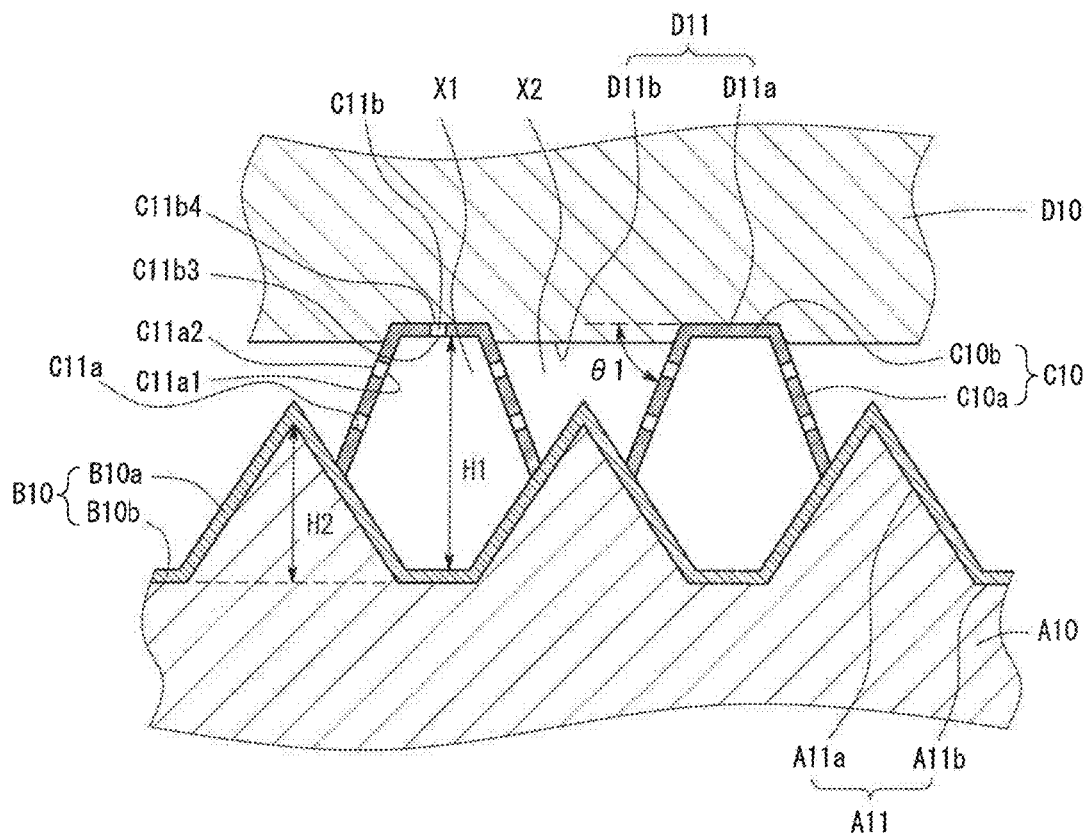
FIG. 2 is an enlarged view of a region around bridging portions in the semiconductor structure of the first embodiment.

FIG. 2 is an enlarged view of a region around the bridging portions C10. As shown in FIG. 2, the bridging portions C10 are formed so as to extend from the sloped portions B10a of the buffer layer B10. The bridging portions C10 are supported by the protrusions A11a of the substrate A10. As shown in FIG. 2, the angle θ1 between the leg portion C10a of each bridging portion C10 and the top portion C10b of the bridging portion C10 is 10° to 90°.

The bridging portions C10 have approximately the same height. Thus, the height at a position of top portion C10b as measured from the bottom portion A11b of the substrate A10 falls within a range of ±10% of the average height of the top portion C10b as measured from the bottom portion A11b.

2-2. Region of Bridging Portion

The bridging portions C10 are formed along the bottom portion A11b of the substrate A10. In particular, the top portions C10b of the bridging portions C10 are located at positions facing the bottom portion A11b of the substrate A10. The semiconductor layer D10 is grown from the top portions C10b.

2-3. Thickness of Bridging Portion

The thickest portion of each bridging portion C10 has a thickness of 0.25 nm to 100 nm, preferably 0.5 nm to 60 nm, more preferably 1 nm to 30 nm. The thickness of each bridging portion C10 may be equal to or greater than a level such that the bridging portion C10 can support the semiconductor layer D10. If the bridging portions C10 have a large thickness, the below-described etching process requires a long period of time. The preferred thickness may depend on the material of the bridging portions C10. If the bridging portions C10 contain Al, the bridging portions C10 may have a large lattice mismatch with the decomposition layers described below. Thus, if the below-described decomposition layers (E1) are formed of GaN and the bridging portions C10 are formed of AlN, the bridging portions C10 preferably have a small thickness.

The leg portions C10a may have a thickness greater than that of the top portions C10b. In such a case, the leg portions C10a exhibit high mechanical strength. Alternatively, the leg portions C10a may have a thickness smaller than that of the top portions C10b. In such a case, the leg portions C10a effectively relax the strain caused by lattice constant difference between the substrate A10 and the leg portions C10. The leg portions C10a exhibit a relatively low mechanical strength. Thus, the semiconductor layer D10 can be readily removed from the substrate A10.

2-4. Through Hole of Bridging Portion

As shown in FIG. 2, each bridging portion C10 has a plurality of through holes. Specifically, the bridging portion C10 has first through holes C11a provided in the leg portion C10a, and second through holes C11b provided in the top portion C10b. The leg portion C10a of the bridging portion C10 has a relatively large number of first through holes C11a. The number of the first through holes C11a of the leg portion C10a is greater than that of the second through holes C11b of the top portion C10b. The density of the first through holes C11a of the leg portion C10a is higher than that of the second through holes C11b of the top portion C10b.

As described below, the first through holes C11a and the second through holes C11b are caused by threading dislocations. The first through holes C11a and the second through holes C11b may have any cross-sectional shape; for example, a circular shape, an elliptical shape, a polygonal shape (e.g., a hexagonal shape), or a stripe shape. Two or more through holes caused by two or more threading dislocations may be connected together, thereby providing a relatively large through hole.

Each second through hole C11b extends from the substrate A10 side toward the semiconductor layer D10. One opening of the second through hole C11b is blocked with the semiconductor layer D10. Thus, at least one of the openings of the through hole is blocked with the semiconductor layer D10. Hence, the semiconductor layer D10 has no through holes.

Each first through hole C11a has a first opening C11a1 and a second opening C11a2. The first opening C11a1 is open toward a first void X1 described below. The second opening C11a2 is not blocked with the semiconductor layer D10, but is open toward a second void X2 described below.

Each second through hole C11b has a third opening C11b3 and a fourth opening C11b4. The third opening C11b3 is open toward a first void X1 described below. The fourth opening C11b4 is blocked with the semiconductor layer D10.

2-5. Void

As shown in FIG. 2, the semiconductor structure Si has first voids X1 and second voids X2 defined between the unevenly shaped portion A11 of the substrate A10 and the semiconductor layer D10.

Each first void X1 is defined by the unevenly shaped portion A11 of the substrate A10 and the bridging portion C10. More specifically, the first void X1 is defined by the bottom portion A11b of the substrate A10, a portion of the protrusion A11a of the substrate A10, the leg portion C10a of the bridging portion C10, and the top portion C10b of the bridging portion C10. In other words, the first void X1 is defined by the bottom portion B10b of the buffer layer B10, a portion of the sloped portion B10a of the buffer layer B10, the leg portion C10a of the bridging portion C10, and the top portion C10b of the bridging portion C10. The first void X1 is located at a position facing the bottom portion A11b of the substrate A10.

Each second void X2 is generally defined by the bridging portion C10 and the semiconductor layer D10. More specifically, the second void X2 is defined by a portion of the protrusion A11a of the substrate A10, the leg portion C10a of the bridging portion C10, and the second site D11b of the semiconductor layer D10. In other words, the second void X2 is defined by a portion of the sloped portion B10a of the buffer layer B10, the leg portion C10a of the bridging portion C10, and the second site D11b of the semiconductor layer D10. The second void X2 is located at a position facing the protrusion A11a of the substrate A10.

The first void X1 is separated from the second void X2 by means of the leg portion C10a of the bridging portion C10. The leg portion C10a of the bridging portion C10 has the through holes C11a. Thus, the first void X1 communicates with the second void X2 via the through holes C11a.

As shown in FIG. 2, the height H1 of the first void X1 in a direction perpendicular to the main surface of the substrate A10 is greater than the height H2 of the protrusion A11a in a direction perpendicular to the main surface of the substrate A10. Thus, the distance between the top of each of the bridging portions C10 and the bottom portion A11b of the substrate A10 is greater than the distance between the top of each of the protrusions A11a of the substrate A10 and the bottom portion A11b of the substrate A10.

Figure 3:
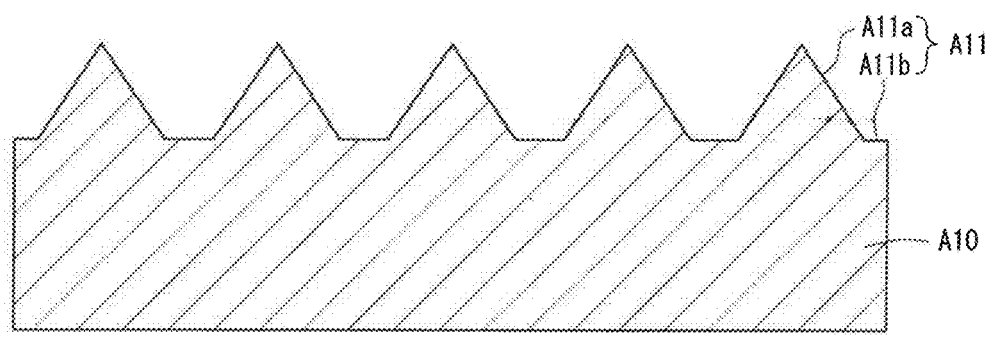
FIG. 3 illustrates a production method for the semiconductor structure of the first embodiment (part 1)

3. Production Method for Semiconductor Structure 3-1. Step of Providing Substrate Firstly, the substrate A10 is provided as shown in FIG. 3. As described above, the substrate A10 has the unevenly shaped portion A11. The unevenly shaped portion A11 of the substrate A10 has a plurality of protrusions A11a and a bottom portion A11b. The protrusions A11a have a conical shape. The protrusions A11a are arranged in a honeycomb pattern on the main surface of the substrate A10. The unevenly shaped portion A11 may be formed through etching of the substrate. Alternatively, the substrate A10 having the unevenly shaped portion A11 may be provided.

3-2. Step of Forming Buffer Layer

Figure 4:
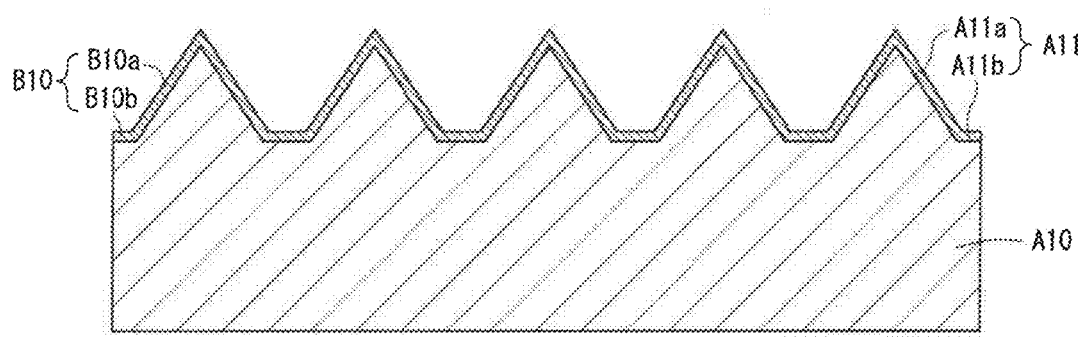
FIG. 4 illustrates the production method for the semiconductor structure of the first embodiment (part 2)

Subsequently, as shown in FIG. 4, the buffer layer B10 is formed on the substrate A10 by means of, for example, MOCVD. The buffer layer B10 has a thickness considerably smaller than the height of the unevenly shaped portion of the substrate A10. Thus, the buffer layer B10 is formed so as to follow the shape of the unevenly shaped portion of the substrate A10. The buffer layer B10 having the sloped portions B10a and the bottom portion B10b is thereby formed. The buffer layer B10 is formed of AlN.

3-3. Step of Forming Decomposition Layer

Figure 5:
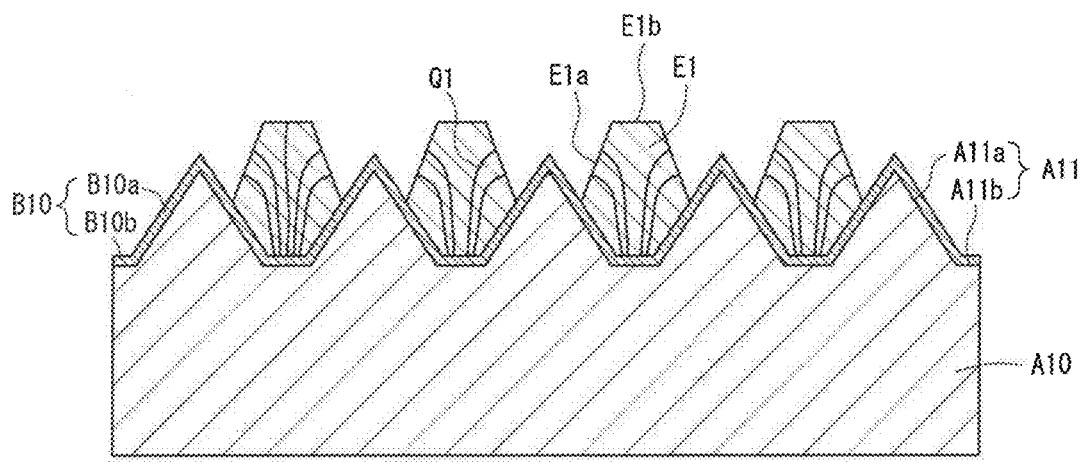
FIG. 5 illustrates the production method for the semiconductor structure of the first embodiment (part 3)

As shown in FIG. 5, decomposition layers E1 are formed on the bottom portion B10b and the sloped portions B10a of the buffer layer B10. InGaN layers are formed as the decomposition layers E1 by means of MOCVD. The InGaN layers are thermally decomposed at a relatively low temperature. The thus-formed decomposition layers E1, which are semiconductor layers, are removed through an etching step described below. That is, the decomposition layers E1 are subjected to at least one of thermal decomposition and decomposition by etching.

Each decomposition layer E1 is grown generally in the vertical direction at an initial stage of growth, and the decomposition layer E1 is grown generally in the horizontal direction at a later stage of growth. Thus, threading dislocations Q1 extend toward a sloped face E1a. Each decomposition layer E1 is grown from the bottom portion B10b of the buffer layer B10 provided on the substrate A10. Consequently, the decomposition layer E1 is formed on the bottom portion A11b of the substrate A10 and a portion of the adjacent protrusions A11a.

The thermal decomposition temperature of the decomposition layers E1 is lower than that of the bridging portions C10. The growth temperature of the decomposition layers E1 is 750° C. to 1,150° C., preferably 900° C. to 1,150° C., more preferably 1,000° C. to 1,120° C.

3-4. Step of Forming Bridging Portion

Figure 6:
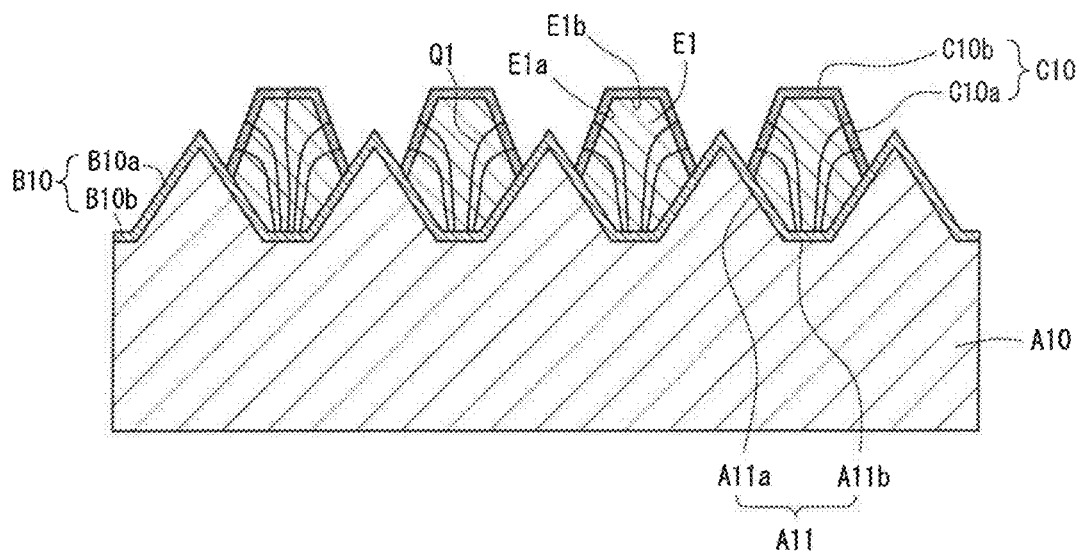
FIG. 6 illustrates the production method for the semiconductor structure of the first embodiment (part 4)

Subsequently, as shown in FIG. 6, the bridging portions C10 are formed on the decomposition layers E1. The bridging portions C10 may be formed by means of MOCVD. Alternatively, the bridging portions C10 may be formed by means of sputtering. As described above, the bridging portions C10 are formed of AlN. The bridging portions C10 are formed so as to cover the decomposition layers E1. The threading dislocations Q1 extend toward the leg portions C10a of the bridging portions C10.

3-5. Etching Step (Decomposition Step)

Figure 7:
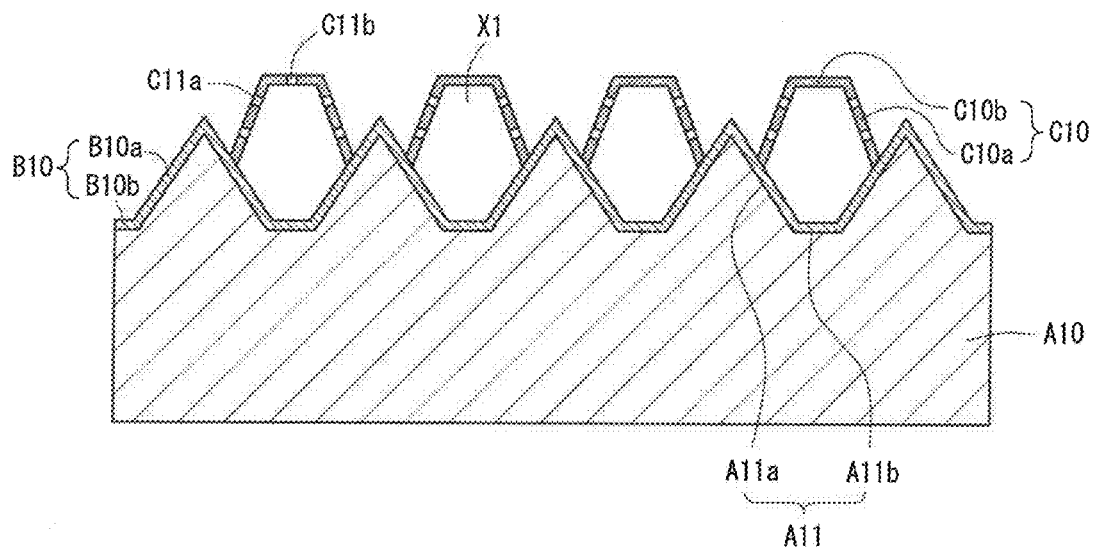
FIG. 7 illustrates the production method for the semiconductor structure of the first embodiment (part 5)

Subsequently, as shown in FIG. 7, the decomposition layers E1 are etched. A gas mixture containing $H_2$ gas and $N_2$ gas is supplied for the etching. $H_2$ gas contained in the gas mixture generally etches the decomposition layers E1. Thus, the partial pressure of $H_2$ gas is preferably increased. However, the supply of $H_2$ gas alone may cause leaching of Ga metal in the form of droplets. Therefore, $N_2$ gas or $NH_3$ gas, or a gas mixture containing $N_2$ gas and $NH_3$ gas is preferably supplied in addition to $H_2$ gas.

The substrate temperature is adjusted to a temperature equal to or higher than the thermal decomposition temperature of the decomposition layers E1 and lower than the thermal decomposition temperature of the bridging portions C10. The surfaces of the bridging portions C10 are etched from the threading dislocations Q1. Consequently, through holes C11a are provided in the leg portions C10a of the bridging portions C10, and through holes C11b are provided in the top portions C10b of the bridging portions C10.

After this, the decomposition layers E1 are thermally decomposed and etched from the through holes C11a and C11b. The decomposition layers E1 are thermally decomposed and etched by means of $H_2$ gas. Since the bridging portions C10 are not thermally decomposed, the bridging portions C10, which have the through holes C11a and C11b, remain after the etching. Thus, the first voids X1 are provided each defined by the substrate A10 and the bridging portion C10.

Preferably, the gas supplied in the etching step does not contain oxygen. Oxygen oxidizes AlN on the surfaces of the bridging portions C10 to thereby form AlON. The presence of AlON probably causes inversion of the polarity of a semiconductor layer above the bridging portions C10. Thus, the formation of AlON on the surfaces of the bridging portions C10 generates a polarity-inverted site and a non-polarity-inverted site in the semiconductor layer D10. Accordingly, the semiconductor layer D10 formed above the bridging portions C10 exhibits poor crystallinity. Thus, preferably, the gas supplied in the etching step does not contain oxygen. In the case where the substrate A10 contains oxygen atoms, oxygen atoms may remain in the reaction furnace. The remaining oxygen atoms may react with AlN on the surfaces of the bridging portions C10 to thereby form AlON. Thus, preferably, the etching step is immediately followed by the subsequent step for preventing the formation of AlON.

3-6. Step of Forming Semiconductor Layer

Subsequently, the semiconductor layer D10 is grown on the bridging portions C10. The semiconductor layer D10 is grown from the top portions C10b of the bridging portions C10. The semiconductor layer is barely grown from the leg portions C10a of the bridging portions C10. Most of the threading dislocations Q1 extend toward the leg portions C10a of the bridging portions C10. Accordingly, the threading dislocations barely extend into the semiconductor layer D10. The semiconductor layer D10 is grown in the horizontal direction at least at an initial stage of growth; hence, the through holes C11b of the top portions C10b are effectively filled. Thus, the resultant semiconductor layer exhibits very low threading dislocation density.

The second voids X2 are provided in association with the growth of the semiconductor layer D10. Each of the second voids X2 is defined by the leg portion C10a of the bridging portion C10, a top portion of the substrate A10, and the semiconductor layer D10. The semiconductor structure S1 is produced through the above-described steps.

4. Effects of Bridging Portion

The semiconductor structure Si of the first embodiment has the first voids X1 between the bridging portions C10 and the substrate A10. Needless to say, the bridging portions C10 are not in contact with the substrate A10 at the first voids X1. Accordingly, no interface is present between the bridging portions C10 and the substrate A10 at the first voids X1. That is, no lattice mismatch occurs at the first voids X1. Thus, the bridging portions C10 may undergo a slight strain at positions where they are in contact with the substrate A10. However, the stress applied from the substrate A10 to the bridging portions C10 is considerably reduced as compared with the case of a conventional semiconductor structure. Even if the thickness of the semiconductor layer D10 is increased, the stress from the substrate A10 is reduced. Therefore, the resultant semiconductor layer D10 exhibits excellent crystallinity.

In the semiconductor structure S1 of the first embodiment, many threading dislocations Q1 extend toward the leg portions C10a of the bridging portions C10, and only a few threading dislocations Q1 extend toward the top portions C10b of the bridging portions C10. The semiconductor layer D10 is grown from the top portions C10b of the bridging portions C10. Accordingly, the threading dislocations generated in the layers below the bridging portions C10 are barely transferred to the semiconductor layer D10. Thus, the semiconductor layer D10 has a very low threading dislocation density. That is, the semiconductor layer D10 exhibits excellent crystallinity.

5. Modifications 5-1. Material of Bridging Portion

In the first embodiment, the bridging portions C10 are composed of an AlN layer formed at a high temperature. The thermal decomposition temperature of the bridging portions C10 is higher than that of the decomposition layers E1. The bridging portions C10 may be composed of an AlN layer formed at a low temperature. The bridging portions C10 may be composed of an AlGaN layer or an AlGaInN layer. The bridging portions C10 preferably contain an Al-containing Group III nitride. The bridging portions C10 may be formed of GaN or InGaN, which depends on the material for the decomposition layers E1.

5-2. Angle Between Top Portion and Leg Portion of Bridging Portion

The angle θ1 between the leg portion C10a and top portion C10b of each bridging portion C10 is 10° to 90°. The angle θ1 may be 0° to 90°. In the case where the angle θ1 is 0°, the leg portion C10a is not distinguished from the top portion C10b.

5-3. Area of Top Portion of Bridging Portion

The area of the top portions C10b of the bridging portions C10 that are in contact with the semiconductor layer D10 is preferably smaller than a half of the area of the main surface of the substrate A10. In such a case, the threading dislocations generated in the layers below the bridging portions C10 are less likely to propagate to the semiconductor layer D10. As used herein, the "main surface" of the substrate A10 refers to the surface of the substrate A10 on which the bridging portions C10 are bridged.

5-4. Absence of Top Portion of Bridging Portion

Bridging portions having no top portions C10b may be formed. In such a case, the semiconductor layer is grown from a portion around the top of the leg portion.

5-5. Thickness of Leg Portion and Top Portion of Bridging Portion

The thickness of the top portion C10b of each bridging portion C10 is preferably greater than that of the leg portion C10a of the bridging portion C10. In such a case, the semiconductor layer D10 having high crystallinity is likely to be grown from the top portions C10b.

5-6. One Body Bridging Portion

In the first embodiment, there are a plurality of bridging portions C10. Bridging portion C10 may be an integral layer (one body layer).

5-7. Bridging Portion Having Multilayer Structure

In the first embodiment, each bridging portion C10 is formed of a single AlN layer. The bridging portion C10 may have a multilayer structure. Alternatively, the bridging portion C10 may have a superlattice structure; for example, a superlattice structure formed of an AlN layer and a GaN layer. Preferably, the entire bridging portion C10 does not have an excessively large thickness.

5-8. Facet Plane of Bridging Portion

The surface of the leg portion C10a of each bridging portion C10 may be a facet plane; for example, (10-1X) plane or (11-2X) plane. The surface of the top portion C10b of the bridging portion C10 may also be a facet plane; for example, (0001) plane. In such a case, the bridging portion C10 has a stable form.

5-9. Crack of Bridging Portion

The bridging portions C10 are preferably formed of a material similar to that used for the semiconductor layer D10. The use of such a similar material can prevent a reduction in crystal quality and an increase in strain, which are caused by lattice constant difference. Cracks may be intentionally generated in the bridging portions C10. In such a case, each bridging portion C10 has at least one crack, and the strain of the semiconductor layer D10 is further reduced. In the case where no cracks are generated, defects are reduced in the semiconductor layer D10. In this case, the semiconductor layer D10 exhibits high crystal quality. The through holes C11a and C11b are generated through etching from the threading dislocations Q1. Meanwhile, cracks are generated by a stress from the substrate A10 or a thermal stress during cooling.

5-10. Material of Decomposition Layer

In the first embodiment, each decomposition layer E1 is an InGaN layer. The decomposition layer E1 may be a GaN layer. The decomposition layer E1 may be doped with Si or Mg. In particular, Si promotes a three-dimensional growth mode (anti-surfactant effect). Thus, the decomposition layer E1 is preferably doped with Si. Needless to say, the decomposition layer E1 preferably has a low thermal decomposition temperature. Hence, the decomposition layer E1 preferably contains In. The incorporation of Al tends to increase the thermal decomposition temperature. In the case where the decomposition layer E1 contains Al, the Al content of the decomposition layer E1 is preferably lower than that of the bridging portions C10. The decomposition layer E1 may be formed of BN or a material other than a Group III nitride (e.g., TiN or SiNx), so long as the decomposition layer E1 has a thermal decomposition temperature lower than that of the bridging portions C10. The decomposition layer E1 is preferably formed of a Group III nitride semiconductor having a composition similar to that of the semiconductor layer formed later. The use of such a Group III nitride semiconductor can prevent the intrusion of impurities into the later-formed semiconductor layer. Thus, the decomposition layer E1 is preferably formed of InGaN.

5-11. Material of Buffer Layer

In the first embodiment, the buffer layer B10 is formed of AlN. The AlN layer includes a low-temperature buffer layer and a high-temperature buffer layer. The buffer layer B10 may be formed of (instead of AlN) a low-temperature GaN buffer layer, a BN layer, a TiN layer, a SiNx layer, or a mixture thereof.

5-12. Unevenly Shaped Portion of Substrate

In the first embodiment, the substrate A10 has a plurality of protrusions A11a and a bottom portion A11b. The protrusions A11a have a conical shape. The protrusions A11a may have a truncated conical shape, a polygonal conical shape, or a truncated polygonal conical shape. In such a case, the unevenly shaped portion of substrate A10 has a bottom portion and a plurality of protrusions extending from the bottom portion. The substrate may have dents instead of the protrusions A11a.

Figure 8:
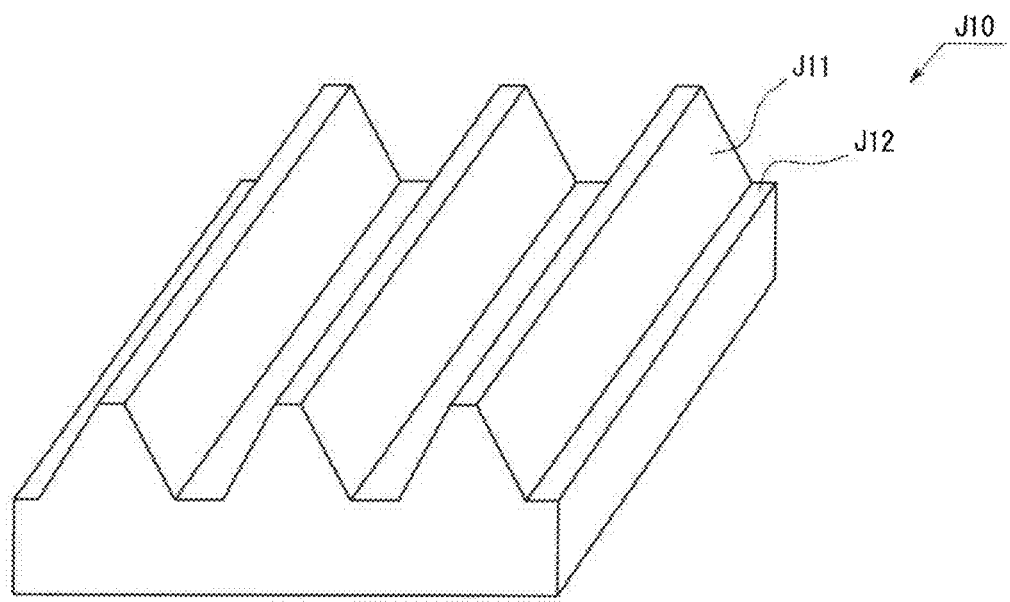
FIG. 8 is a perspective view of a substrate of a semiconductor structure according to a modification of the first embodiment.

FIG. 8 is a perspective view of a substrate J10 of a light-emitting device according to a modification of the first embodiment. As shown in FIG. 8, the substrate J10 having a stripe-pattern unevenly shaped portion may be used. The substrate J10 has ridge-shaped protrusions J11 and a bottom portion J12. Thus, the technique of the first embodiment is applicable to another uneven substrate. The uneven substrate may have a non-periodic structure.

5-13. Etching Step (Thermal Decomposition Step)

The etching step involves supply of a gas mixture of $H_2$ gas and $N_2$ gas. However, $N_2$ gas may be supplied. In such a case, the decomposition layers E1 are not etched by $H_2$ gas, but are only thermally decomposed. In such a case, the decomposition layers E1 can be removed if the bridging portions C10 have a sufficiently small thickness.

5-14. Residue

In the first embodiment, the decomposition layers E1 are removed through etching. However, a portion of the decomposition layers E1 may remain as a residue in the semiconductor structure S1. In such a case, the residue remains in the first voids X1. The residue contains, for example, InGaN or GaN.

5-15. Absence of Second Voids

The semiconductor structure S1 of the first embodiment has the second voids X2. However, the second voids X2 may be filled with the semiconductor layer D10. In such a case, the second site D11b of the semiconductor layer D10 is in contact with the protrusion A11a of the substrate A10 and the leg portion C10a of the bridging portion C10. Therefore, the height of the top portion C10b as measured from the substrate A10 is reduced and the semiconductor layer is grown in the horizontal direction on the top portion C10b so as to wrap around that the leg portions C10a of the bridging portions C10 or the protrusions A11a of the substrate A10. In this case, the through holes C11a of the leg portions C10a and the through holes C11b of the top portions C10b are blocked with the semiconductor layer D10.

5-16. Layered Structure of Semiconductor Layer

In the first embodiment, the semiconductor layer D10 is composed of one or more semiconductor layers. The semiconductor layer D10 may have any layered structure.

5-17. Semiconductor Device

Electrodes may be provided on the semiconductor layer D10 of the first embodiment, to thereby produce a semiconductor device.

5-18. Combination

The above-described modifications may be used in any combination.

6. Summary of First Embodiment

As described above in detail, the semiconductor structure S1 of the first embodiment includes the substrate A10, the bridging portions C10, the semiconductor layer D10, and the first voids X1 provided between the substrate A10 and the bridging portions C10. The threading dislocations Q1 extend from the decompositions layer E1 toward a region for forming the leg portions C10a of the bridging portions C10. The semiconductor layer D10 is grown from the top portions C10b of the bridging portions C10. Accordingly, the threading dislocations Q1 are barely transferred to the semiconductor layer D10. Thus, the semiconductor layer D10 included in the semiconductor structure S1 exhibits excellent crystallinity.

The above-described embodiment is merely an example. Thus, needless to say, various modifications and variations may be made without departing from the scope of the embodiment. For example, the semiconductor layer is not necessarily grown through metal-organic chemical vapor deposition (MOCVD), and may be grown by any other crystal growth method using a carrier gas. Alternatively, the semiconductor layer may be formed by another epitaxial growth method, such as liquid-phase epitaxy or molecular beam epitaxy.

Second Embodiment

1. Semiconductor Light-Emitting Device

Figure 9:
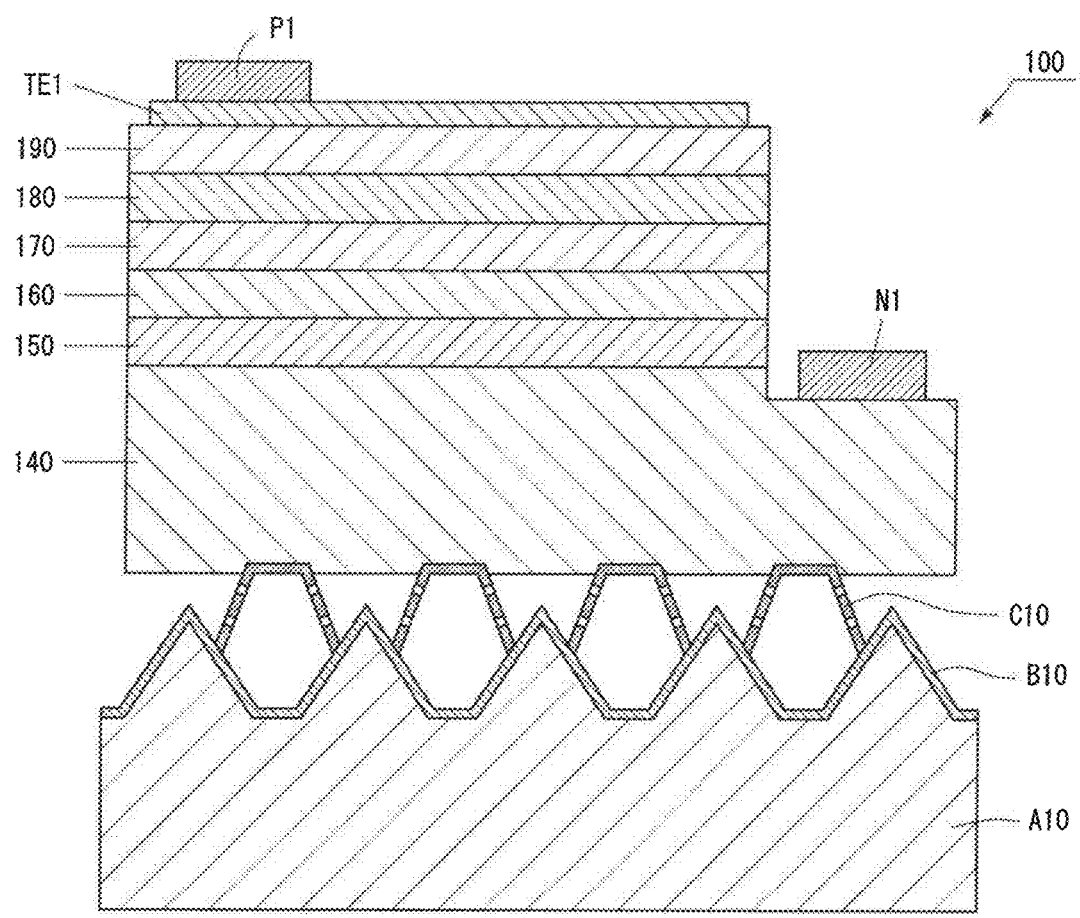
FIG. 9 schematically shows the configuration of a light-emitting device of a second embodiment.

FIG. 9 schematically shows the configuration of a light-emitting device 100 of the second embodiment. The light-emitting device 100 is an example of the semiconductor structure S1 of the first embodiment. As shown in FIG. 9, the light-emitting device 100 is a face-up type semiconductor light-emitting device. The light-emitting device 100 includes a plurality of Group III nitride semiconductor layers. Needless to say, the light-emitting device 100 is a type of semiconductor device.

As shown in FIG. 9, the light-emitting device 100 includes a substrate A10, a buffer layer B10, bridging portions C10, an n-type contact layer 140, an n-side electrostatic breakdown preventing layer 150, an n-side superlattice layer 160, a light-emitting layer 170, a p-side cladding layer 180, a p-type contact layer 190, a transparent electrode TE1, an n-electrode N1, and a p-electrode P1. The n-type contact layer 140, the n-side electrostatic breakdown preventing layer 150, and the n-side superlattice layer 160 are n-type semiconductor layers. The n-type semiconductor layer is a first semiconductor layer of a first conductive type. The p-side cladding layer 180 and the p-type contact layer 190 are p-type semiconductor layers. The p-type semiconductor layer is a second semiconductor layer of a second conductive type. The n-type semiconductor layer may include, for example, a ud-GaN layer that is not doped with a donor. The p-type semiconductor layer may include, for example, a ud-GaN layer that is not doped with an acceptor. The n-type semiconductor layer, the light-emitting layer 170, and the p-type semiconductor layer correspond to the semiconductor layer D10 of the first embodiment.

The substrate A10, the buffer layer B10, and the bridging portions C10 are the same as those in the first embodiment.

The n-type contact layer 140 is provided for achieving ohmic contact with the n-electrode N1. The n-type contact layer 140 is formed on the top portions C10b of the bridging portions C10. The n-electrode N1 is located on the n-type contact layer 140. The n-type contact layer 140 is formed of, for example, n-type GaN.

The n-side electrostatic breakdown preventing layer 150 is provided for preventing the electrostatic breakdown of each semiconductor layer. The n-side electrostatic breakdown preventing layer 150 is formed on the n-type contact layer 140. The n-side electrostatic breakdown preventing layer 150 includes, for example, a ud-GaN (unintentionally doped GaN) layer and an n-type GaN layer. The n-side electrostatic breakdown preventing layer 150 may have a structure other than that described above.

The n-side superlattice layer 160 serves as a strain relaxation layer for relaxing a stress applied to the light-emitting layer 170. More specifically, the n-side superlattice layer 160 is a superlattice layer having a superlattice structure. The n-side superlattice layer 160 is formed on the n-side electrostatic breakdown preventing layer 150. The n-side superlattice layer 160 is formed through, for example, repeated depositing of layer units each including an InGaN layer and a GaN layer. Needless to say, these semiconductor layers may be formed of other materials.

The light-emitting layer 170 emits light through recombination of electrons and holes. The light-emitting layer 170 is formed on the n-side superlattice layer 160. The light-emitting layer 170 is formed through repeated depositing of layer units each including a well layer and a barrier layer. That is, the light-emitting layer 170 has a multiple quantum well structure. The light-emitting layer 170 may include a cap layer formed on the well layer. The light-emitting layer 170 may have a single quantum well structure.

The p-side cladding layer 180 is formed on the light-emitting layer 170. The p-side cladding layer 180 is formed through repeated depositing of layer units each including a p-type InGaN layer and a p-type AlGaN layer. Needless to say, these semiconductor layers may be formed of other materials.

The p-type contact layer 190 is provided for achieving ohmic contact with the transparent electrode TE1. The p-type contact layer 190 is formed on the p-side cladding layer 180.

The transparent electrode TE1 is provided for diffusing current in the light-emitting surface. The transparent electrode TE1 is formed on the p-type contact layer 190. The transparent electrode TE1 is preferably formed of any of ITO, IZO, ICO, ZnO, $TiO_2$, $NbTiO_2$, $TaTiO_2$, and $SnO_2$.

The p-electrode P1 is formed on the transparent electrode TE1. The p-electrode P1 is formed of a combination of one or more of, for example, Ni, Au, Ag, and Co. Needless to say, the p-electrode P1 may be formed of any other material. The p-electrode P1 is conducted to the p-type semiconductor layers.

The n-electrode N1 is formed on the n-type contact layer 140. The n-electrode N1 is formed of a combination of one or more of, for example, Ni, Au, Ag, and Co. Needless to say, the n-electrode N1 may be formed of any other material. The n-electrode N1 is conducted to the n-type semiconductor layers.

The light-emitting device 100 may include a protective film for protecting the semiconductor layers.

2. Bridging Portion and Void
2-1. Bridging Portion

Figure 10:
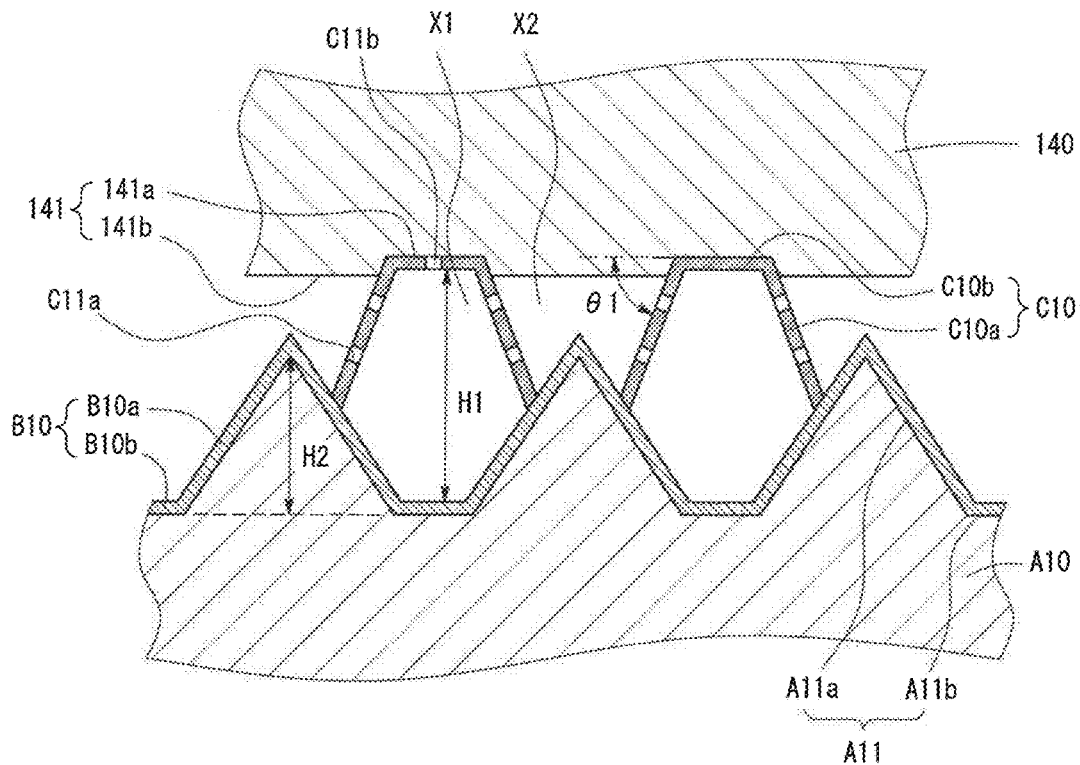
FIG. 10 is an enlarged view of a region around bridging portions in the light-emitting device of the second embodiment.

FIG. 10 is an enlarged view of a region around the bridging portions C10. As shown in FIG. 10, the bridging portions C10 are bridged so as to extend from the sloped portions B10a of the buffer layer B10. The leg portion C10a of each bridging portion C10 is at an angle of 10° to 90° with respect to the top portion C10b of the bridging portion C10.

The n-type contact layer 140 has a portion 141a of the bottom surface 141 and a remaining portion 141b of the bottom surface 141. The portion 141a of the bottom surface 141 is in contact with the top portion C10b of the bridging portion C10. The remaining portion 141b of the bottom surface 141 faces the second void X2. The second void X2 is defined by the remaining portion 141b, the leg portion C11a of the bridging portion C10, and a portion of the protrusions A11a of the substrate A10.

2-2. Void

As shown in FIG. 10, the light-emitting device 100 has first voids X1 and second voids X2 between the unevenly shaped portion A11 of the substrate A10 and the n-type contact layer 140.

2-3. Effects of Void

In the second embodiment, the first voids X1 and the second voids X2 are present between the substrate A10 and the n-type contact layer 140. Thus, light emitted from the light-emitting layer 170 toward the substrate A10 is reflected or scattered at the first voids X1 and the second voids X2. The reflection or scattering of light is caused by the difference in refractive index between the semiconductor layer and air. The reflection or scattering of light improves light extraction performance.

3. Production Method for Semiconductor Light-Emitting Device

Now will be described a method for producing the light-emitting device 100 of the second embodiment. The semiconductor light-emitting device of the second embodiment is produced by using the method for producing the bridging portions and voids described in the first embodiment.

The aforementioned respective semiconductor layers are epitaxially grown through metal-organic chemical vapor deposition (MOCVD). The carrier gas used in the method is hydrogen ($H_2$), nitrogen ($N_2$), or a gas mixture of hydrogen and nitrogen ($H_2+N_2$). Ammonia gas ($NH_3$) is used as a nitrogen source. Trimethylgallium ($Ga(CH_3)_3$) is used as a Ga source. Trimethylindium ($In(CH_3)_3$) is used as an In source. Trimethylaluminum ($Al(CH_3)_3$) is used as an Al source. Silane ($SiH_4$) is used as an n-type dopant gas. Bis(cyclopentadienyl)magnesium ($Mg(C_5H_5)_2$) is used as a p-type dopant gas. Gases other than those described above may be used.

3-1. Cleaning of Substrate

The substrate A10 is cleaned with $H_2$ gas. The substrate temperature is adjusted to about 1,100° C. Needless to say, the cleaning may be carried out at another substrate temperature.

3-2. Production of Bridging Portion and Void

The bridging portions C10, the first voids X1, and the second voids X2 are produced by the method for producing the bridging portions and voids described above.

3-3. Step of Forming n-Type Contact Layer

Subsequently, the n-type contact layer 140 is formed on the bridging portions C10. In this case, the n-type contact layer 140 is grown from the top portions C11b of the bridging portions C10. In this process, the substrate temperature is adjusted to 900° C. to 1,140° C.

3-4. Step of Forming n-Side Electrostatic Breakdown Preventing Layer

Thereafter, the n-side electrostatic breakdown preventing layer 150 is formed on the n-type contact layer 140. The ud-GaN layer and the n-type GaN layer are formed in this order. In this step, the substrate temperature may be the same as that in the n-type contact layer formation step. The substrate temperature may be lowered during formation of the n-side electrostatic breakdown preventing layer 150 for facilitating formation of pits. The formation of pits can improve electrostatic breakdown preventing performance and yield.

3-5. Step of Forming n-Side Superlattice Layer

Subsequently, the n-side superlattice layer 160 is formed on the n-side electrostatic breakdown preventing layer 150. The n-side superlattice layer 160 is formed through repeated depositing of layer units each including an InGaN layer and a GaN layer.

3-6. Step of Forming Light-Emitting Layer

Thereafter, the light-emitting layer 170 is formed on the n-side superlattice layer 160. The light-emitting layer 170 is formed through repeated depositing of layer units each including a well layer and a barrier layer. A cap layer may be formed after formation of the well layer.

3-7. Step of Forming p-Side Cladding Layer

Subsequently, the p-side cladding layer 180 is formed on the light-emitting layer 170. In this step, p-type InGaN layers and p-type AlGaN layers are repeatedly deposited.

3-8. Step of Forming p-Type Contact Layer

Thereafter, the p-type contact layer 190 is formed on the p-side cladding layer 180.

3-9. Step of Forming Transparent Electrode

Subsequently, the transparent electrode TE1 is formed on the p-type contact layer 190

3-10. Electrode Formation Step

Thereafter, the p-electrode P1 is formed on the transparent electrode TE1. Laser processing or etching is then carried out from the top surface of the p-type contact layer 190, to thereby expose a portion of the n-type contact layer 140 through the corresponding portions of the semiconductor layers. The n-electrode N1 is formed on the exposed portion of the n-type contact layer 140. The p-electrode P1 formation step may be preceded or followed by the n-electrode N1 formation step.

3-11. Other Steps

In addition to the above-described steps, other steps (including a thermal treatment step and an insulation film formation step) may be carried out. Thus, the light-emitting device 100 shown in FIG. 9 is produced.

4. Modifications
4-1. Flip-Chip

The technique of the second embodiment is applicable to a flip-chip type semiconductor light-emitting device.

4-2. N-Type Contact Layer

The composition of the n-type contact layer 140 is constant therein. However, the composition may be gradually varied in the n-type contact layer 140. An AlN layer, an AlGaN layer, an InGaN layer, or an AlGaInN layer may further be formed between the n-type contact layer 140 and the bridging portions C10. These layers may be doped with Si.

4-3. Layered Structure of Semiconductor Layer

In the second embodiment, the n-type contact layer 140, the n-side electrostatic breakdown preventing layer 150, the n-side superlattice layer 160, the light-emitting layer 170, the p-side cladding layer 180, and the p-type contact layer 190 are sequentially formed on the bridging portions C10. Needless to say, the light-emitting device may have any other layered structure. For example, one or more semiconductor layer may be formed between the bridging portions C10 and the n-type contact layer 140. Such one or more semiconductor layer may be, for example, an undoped-GaN layer. Each of the aforementioned layers may have a structure other than that described in the second embodiment.

4-4. Combination

The above-described modifications may be used in any combination. These modifications may be used in any combination with the first embodiment and its modifications.

5. Summary of Second Embodiment

As described above in detail, the light-emitting device 100 of the second embodiment includes the bridging portions C10, the first voids X1, and the second voids X2 between the uneven substrate A10 and the n-type semiconductor layer. Since the voids are present between the substrate A10 and the semiconductor layer, light emitted from the light-emitting layer 170 is sufficiently scattered. Thus, the light-emitting device 100 exhibits high light extraction performance. As in the case of the first embodiment, the semiconductor layers formed above the n-type contact layer 140 exhibit good crystallinity, since the bridge structure of the bridging portions C10 reduces the stress between the substrate and the semiconductor layers.

The above-described embodiment is merely an example. Thus, needless to say, various modifications and variations may be made without departing from the scope of the disclosure. For example, the semiconductor layer is not necessarily grown through metal-organic chemical vapor deposition (MOCVD), and may be grown by any other crystal growth method using a carrier gas. Alternatively, the semiconductor layer may be formed by another epitaxial growth method, such as liquid-phase epitaxy or molecular beam epitaxy.

Third Embodiment

The third embodiment will now be described. The third embodiment involves the use of a substrate having truncated conical protrusions. Thus, the third embodiment will be described by focusing on the difference from the first embodiment.

1. Semiconductor Structure

Figure 11:
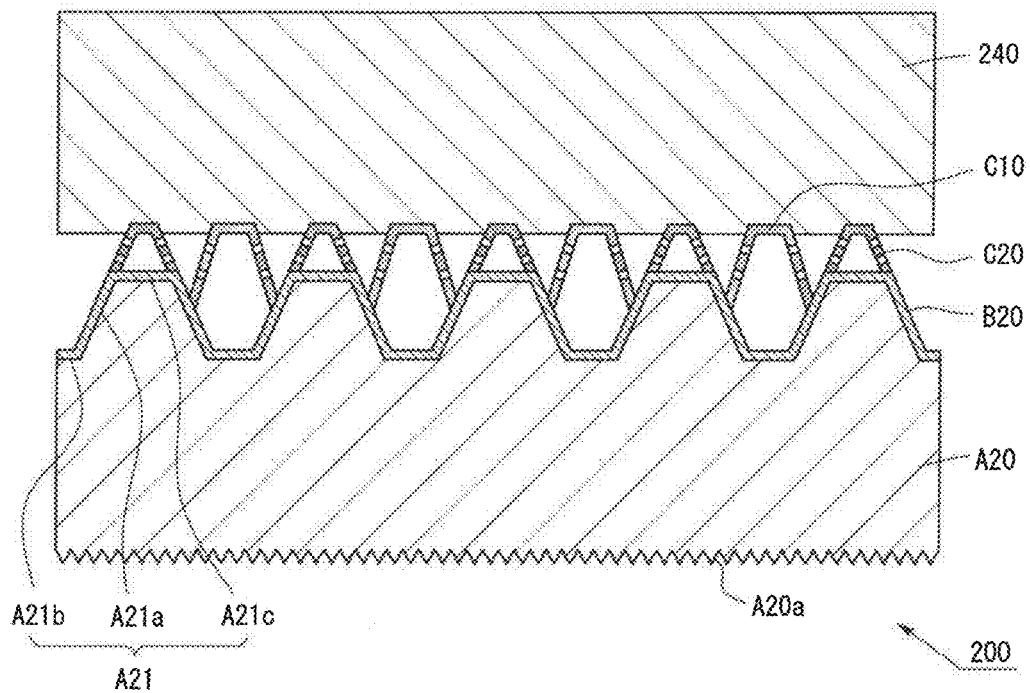
FIG. 11 schematically shows the configuration of a semiconductor structure of a third embodiment.

FIG. 11 schematically shows the configuration of a semiconductor structure 200 of the third embodiment.

The substrate A20 has an unevenly shaped portion A21. The unevenly shaped portion A21 has sloped faces A21a, bottom faces A21b, and top faces A21c. The bridging portions C10 are supported by the sloped faces A21a of the substrate A20.

The bridging portions C20 are supported by the top faces A21c of the substrate A20. Thus, the bridging portions C20 may be grown from the top faces A21c of the unevenly shaped portion A21 of the substrate A20.

2. Modifications

The semiconductor structure may include bridging portions grown from the bottom faces A21b of the substrate A20. In such a case, the bridging portions are supported by the bottom faces A21b of the substrate A20.

Fourth Embodiment

The fourth embodiment will now be described. The fourth embodiment involves the use of an uneven substrate on which a semiconductor layer having a non-polar or semi-polar flat surface is grown. Thus, the fourth embodiment will be described by focusing on the difference from the first embodiment.

1. Semiconductor Structure

Figure 12:
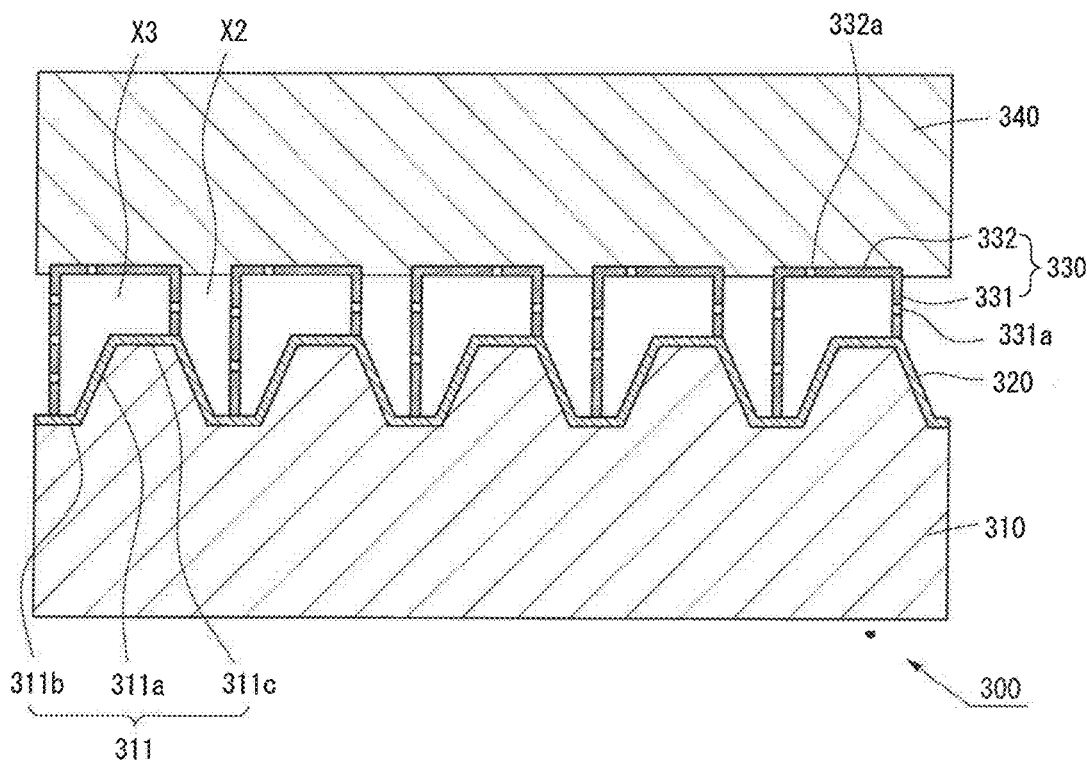
FIG. 12 schematically shows the configuration of a semiconductor structure of a fourth embodiment.

FIG. 12 schematically shows the configuration of a semiconductor structure 300 of the fourth embodiment.

In the fourth embodiment, the substrate 310 has an unevenly shaped portion 311. The substrate 310 has sloped portions 311a, bottom portions 311b, and top portions 311c. The bottom portions 311b and the top portions 311c are mutually parallel flat surfaces. The sloped portions 311 are side portions of the unevenly shaped portion 311. The buffer layer 320 is formed along the unevenly shaped portion of the substrate 310.

The bridging portions 330 are formed on the bottom portions 311b and the top portions 311c of the substrate 310. Each bridging portion 330 has a leg portion 331 and a top portion 332. The top portion 332 is a non-polar or semi-polar surface. The leg portion 331 is inclined by about 90° relative to the top portion 332.

Each bridging portion 330 is formed to cover the bottom portion 311b of the substrate 310 and the top portion 311c of the substrate 310.

The semiconductor layer 340 is grown generally from the top portions 332 of the bridging portions 330.

2. Void

The semiconductor structure 300 has voids X3. The voids X3 are first voids. The voids X3 are located between the unevenly shaped portion 311 of the substrate 310 and the semiconductor layer 340. The voids X3 are defined by the unevenly shaped portion 311 of the substrate 310 and the bridging portions 330. In other words, the voids X3 are defined by the buffer layer 320 and the bridging portions 330.

3. Growth of Decomposition Layer

In the fourth embodiment, the decomposition layer is grown through the technique disclosed in Japanese Patent Application Laid-Open (kokai) No. 2013-241337. Thus, the semiconductor layer is grown as shown in FIG. 1.B of Japanese Patent Application Laid-Open (kokai) No. 2013-241337.

4. Effects of Fourth Embodiment

In the fourth embodiment, since the top surface of the light-emitting layer is a non-polar or semi-polar surface, a sufficiently small piezoelectric field is applied to the light-emitting layer.

The semiconductor structure 300 of the fourth embodiment has voids X3. The semiconductor layer 340 is grown generally from the top portions 332 of the bridging portions 330. Thus, the semiconductor layer 340 exhibits a relatively low threading dislocation density. That is, the semiconductor layer exhibits high crystallinity.

5. Modifications

The fourth embodiment may use any combination of the first and second embodiments and their modifications.

Fifth Embodiment

The fifth embodiment will now be described. The fifth embodiment involves the use of a substrate having no unevenly shaped portion on its main surface. Thus, the fifth embodiment will be described by focusing on the difference from the first embodiment.

1. Semiconductor Structure

Figure 13:
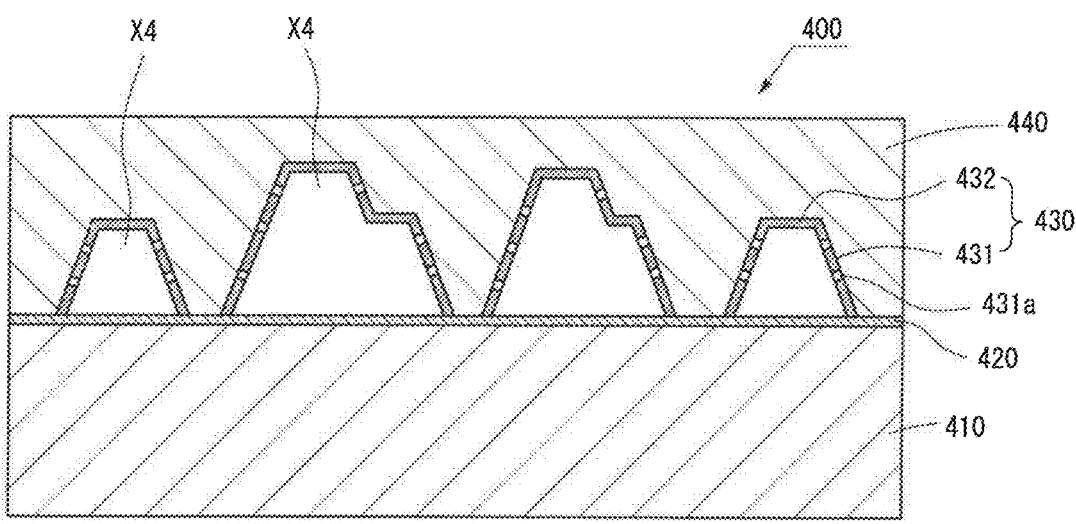
FIG. 13 schematically shows the configuration of a semiconductor structure of a fifth embodiment.

FIG. 13 schematically shows the configuration of a semiconductor structure 400 of the fifth embodiment. The semiconductor structure 400 includes a substrate 410, a buffer layer 420, bridging portions 430, and a semiconductor layer 440.

As shown in FIG. 13, the main surface of the substrate 410 (i.e., the surface on which the semiconductor layer is formed) has no unevenly shaped portion. Thus, the main surface of the substrate 410 is a flat surface; i.e., the substrate 410 has a flat surface. The flat buffer layer 420 is formed on the flat substrate 410.

The bridging portions 430 are grown from the flat surface of the substrate 410. That is, the bridging portions 430 are supported by the main surface of the substrate 410. In other words, the bridging portions 430 are formed on the buffer layer 420. The bridging portions 430 are formed to cover the flat buffer layer 420. Each bridging portion 430 has a leg portion 431 and a top portion 432. The leg portion 431 is grown from the flat buffer layer 420.

The bridging portions 430 are arranged in a non-periodic manner. The bridging portions 430 have uneven heights and widths.

The semiconductor layer 440 is grown generally from the top portions 432 of the bridging portions 430. In some cases, the semiconductor layer 440 may be grown from exposed portions of the buffer layer 420. The semiconductor layer 440 has an unevenly shaped portion corresponding to the bridging portions 430 having uneven heights and widths.

2. Void

The semiconductor structure 400 has voids X4. The voids X4 are first voids. The voids X4 are located between the flat surface of the substrate 410 and the semiconductor layer 440. The voids X4 are defined by the flat surface of the substrate 410 and the bridging portions 430. In other words, the voids X4 are defined by the buffer layer 420 and the bridging portions 430. In the fifth embodiment, the substrate 410 has no unevenly shaped portion, and thus the voids X4 are randomly located on the substrate 410. That is, the bridging portions 430 and the voids X4 are arranged in a non-periodic manner.

3. Effects of Fifth Embodiment

The semiconductor structure 400 of the fifth embodiment has voids X4. The semiconductor layer 440 is grown generally from the top portions 432 of the bridging portions 430. Thus, the semiconductor layer 440 exhibits a relatively low threading dislocation density. That is, the semiconductor layer of the semiconductor structure 400 exhibits high crystallinity.

In the fifth embodiment, in many cases, decomposition layers are discretely formed in an island pattern. Thus, the bridging portions 430 are also discretely arranged in an island pattern.

4. Modifications

The fifth embodiment may use any combination of the first and second embodiments and their modifications.

Sixth Embodiment

The sixth embodiment will now be described.

1. Semiconductor Structure

Figure 14:
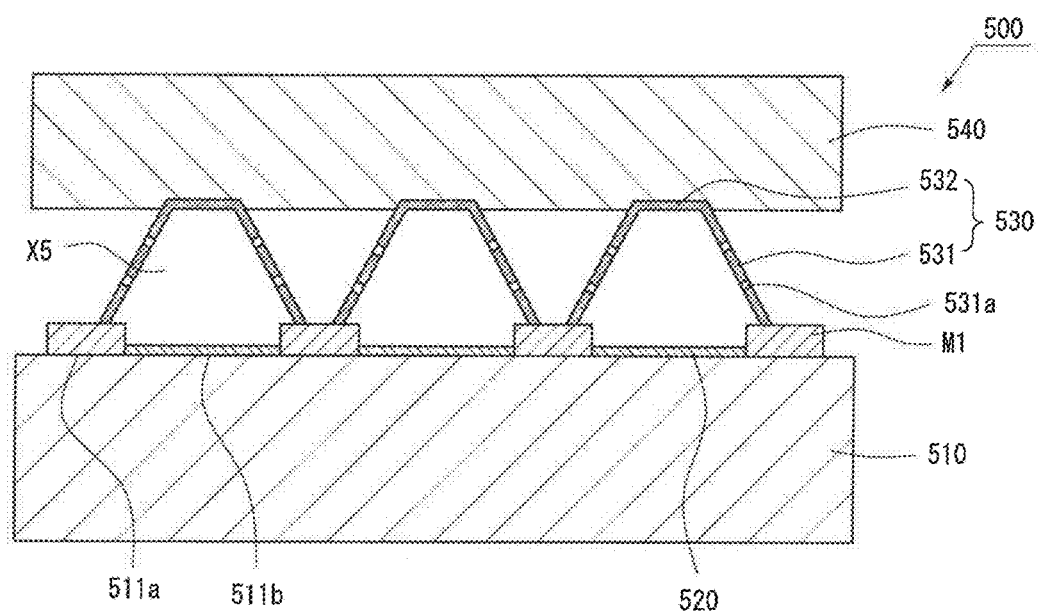
FIG. 14 schematically shows the configuration of a semiconductor structure of a sixth embodiment.

FIG. 14 schematically shows the configuration of a semiconductor structure 500 of the sixth embodiment. The semiconductor structure 500 includes a substrate 510, mask layers Ml, a buffer layer 520, bridging portions 530, and a semiconductor layer 540.

In the sixth embodiment, the substrate 510 has no unevenly shaped portion on its main surface. The substrate 510 has a flat main surface. The main surface is a first surface. The mask layers Ml are formed on portions 511a of the main surface of the substrate 510. The buffer layer 520 is formed on the remaining portions 511b of the main surface of the substrate 510.

The buffer layer 520 is formed on the portions other than the mask layers Ml.

The bridging portions 530 are formed so as to be in contact with the mask layers Ml. The bridging portions 530 are formed so as to bridge at positions near the interfaces of the mask layers Ml. The bridging portions 530 have a plurality of top portions 532. The height of at a position of the top portions 532 as measured from the main surface of the substrate 510 falls within a range of ±10% of the average of the heights of the top portions 532 as measured from the main surface.

The semiconductor layer 540 is grown generally from the top portions 532 of the bridging portions 530.

2. Void

The semiconductor structure 500 has voids X5. The voids X5 are first voids. The voids X5 are provided at positions facing the buffer layer 520 formed on the substrate 510. The voids X5 are defined by the buffer layer 520 and the bridging portions 530.

3. Effects of Sixth Embodiment

The semiconductor layer 540 is grown generally from the top portions 532 of the bridging portions 530. Thus, the semiconductor layer 540 exhibits a relatively low threading dislocation density. That is, the semiconductor layer of the semiconductor structure 500 exhibits high crystallinity.

4. Production Method for Semiconductor Light-Emitting Device

The production method for the semiconductor light-emitting device will be described by focusing on the difference from the first embodiment.

4-1. Step of Forming Mask Layer

The mask layers Ml are formed on a portion 511a of the substrate 510. For example, the mask layers Ml are formed from $SiO_2$.

4-2. Step of Forming Buffer Layer

Subsequently, the buffer layer 520 is formed on the remaining portion 511b of the substrate 510. In this case, the buffer layer 520 is not formed on the mask layers Ml. Even if the buffer layer is formed on the mask layers Ml, the buffer layer on the mask layers Ml exhibits poor crystal quality. Thus, the decomposition layer E1 is not grown from the buffer layer on the mask layers Ml.

4-3. Step of Forming Decomposition Layer

Thereafter, the decomposition layers E1 are formed on the buffer layer 520. The formation of the decomposition layers E1 is the same as that described in the first embodiment. The subsequent steps are the same as those described in the first embodiment.

5. Modifications
5-1. Mask Pattern and Bridging Portion Shape
The decomposition layers having any three-dimensional shape can be formed depending on the pattern of the masks Ml. The shape of the decomposition layers is transferred to the bridging portions. Thus, the resultant bridging portions can have any shape.

5-2. Combination
The sixth embodiment may use any combination of the first and second embodiments and their modifications.

Seventh Embodiment

The seventh embodiment will now be described.

Figure 15:
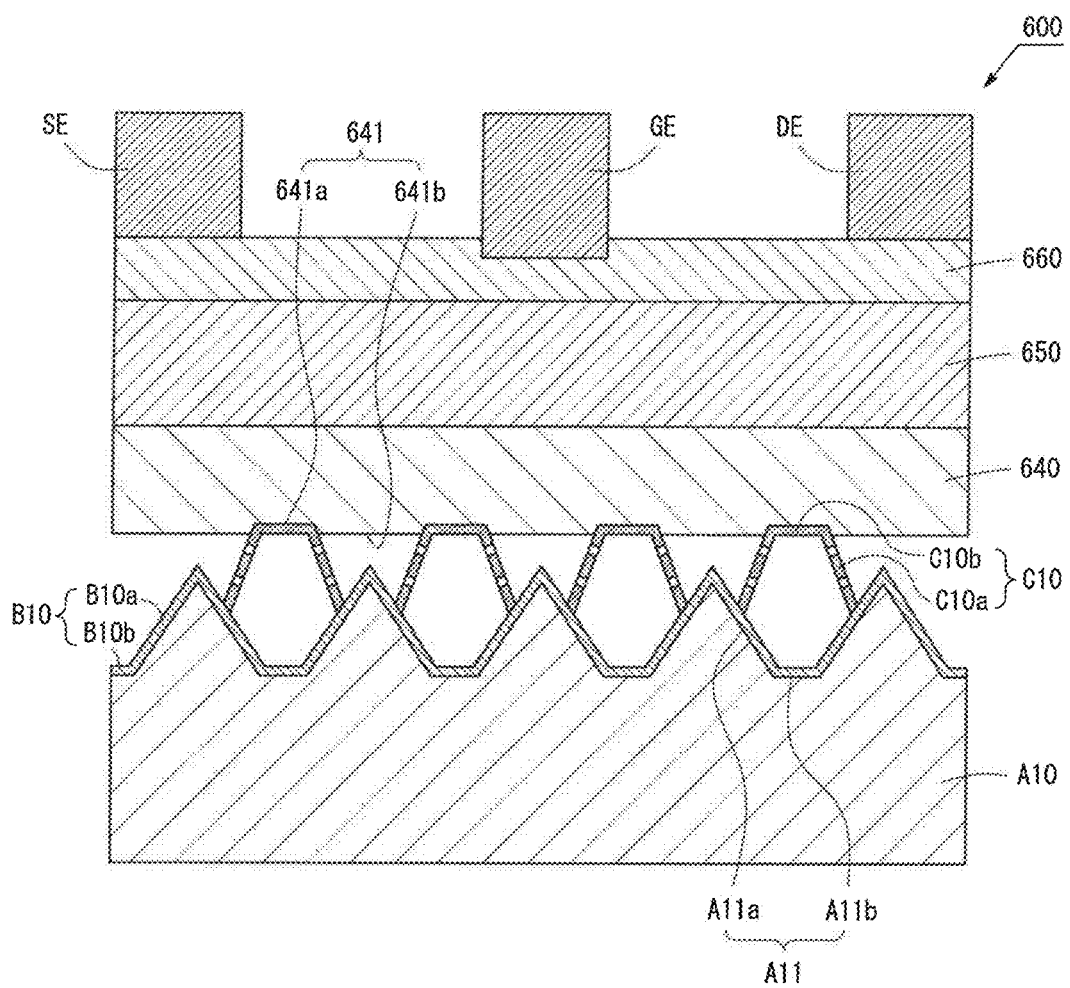
FIG. 15 schematically shows the configuration of a power device of a seventh embodiment.

1. Power Device
FIG. 15 schematically shows the configuration of a power device 600 of the seventh embodiment. Needless to say, the power device 600 is a type of semiconductor device. The power device 600 is an example of the semiconductor structure S1 of the first embodiment. The power device 600 includes a substrate A10, a buffer layer B10, bridging portions C10, an underlying layer 640, a carrier traveling layer 650, a carrier supply layer 660, a gate electrode GE, a source electrode SE, and a drain electrode DE. The source electrode SE and the drain electrode DE are formed on the carrier supply layer 660.

The underlying layer 640 is formed of, for example, AlN or GaN. Carriers supplied from the carrier supply layer 660 travel through the carrier traveling layer 650. The carrier traveling layer 650 is formed of, for example, GaN. The carrier supply layer 660 supplies carriers to the carrier traveling layer 650. The carrier supply layer 660 is formed of, for example, AlGaN.

The underlying layer 640 has a portion 641a of a bottom surface 641 and a remaining portion 641b of the bottom surface 641. The portion 641a of the bottom surface 641 faces the top portions C10b of the bridging portions C10. The remaining portion 641b of the bottom surface 641 is barely in contact with the bridging portions C10.

2. Modifications
As described in the second and seventh embodiments, the semiconductor device may include any semiconductor layer or any electrode above the bridging portions C10. Thus, the semiconductor device is applicable to a variety of semiconductor devices, including a light-emitting device and a power device. The embodiment may use any combination of the first and their modifications.

EXAMPLES

Figure 16:
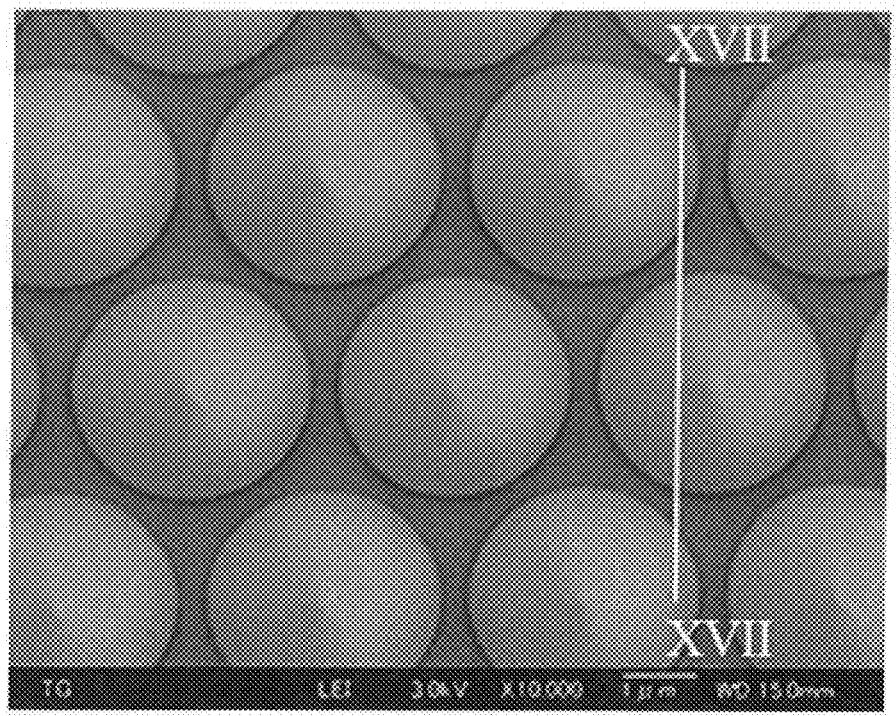
FIG. 16 is a scanning micrograph showing the surface of an uneven sapphire substrate used in experiments A to C.
Figure 17:
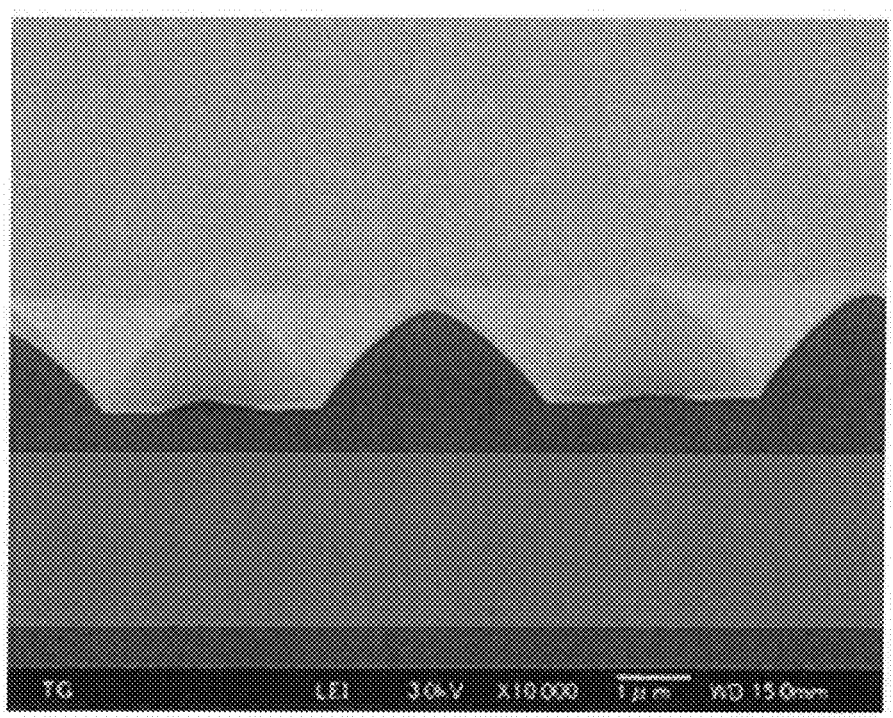
FIG. 17 is a cross-sectional view taken along line XVII-XVII of FIG. 16.

1. Experiment A
1-1. Substrate
FIG. 16 is a scanning micrograph showing the surface of an uneven sapphire substrate. FIG. 17 is a cross-sectional view taken along line XVII-XVII of FIG. 16. As shown in FIGS. 16 and 17, a plurality of conical protrusions are arranged in a honeycomb pattern.

Figure 18:
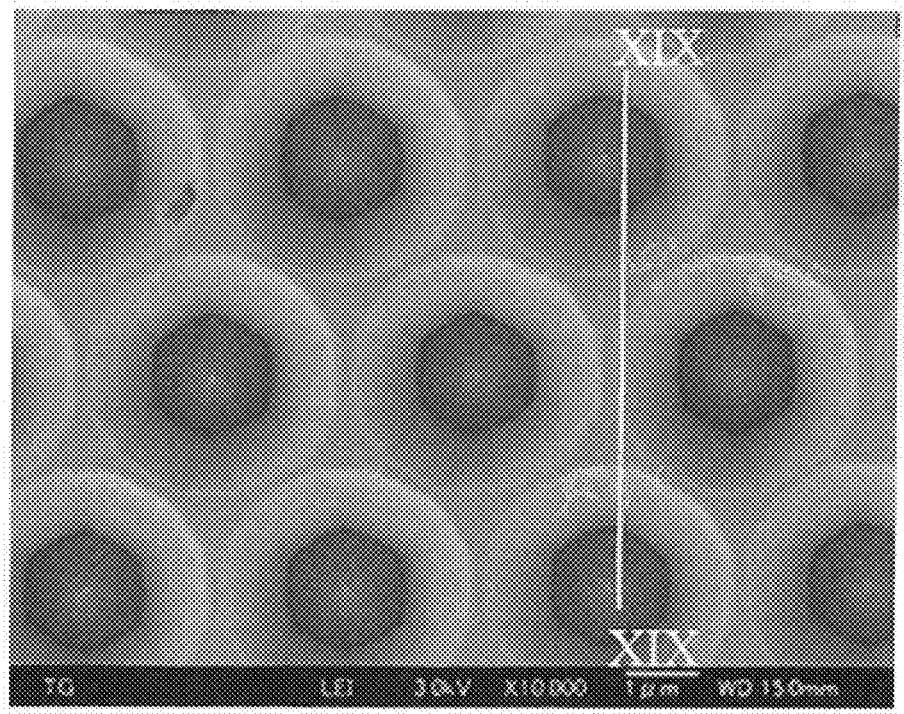
FIG. 18 is a scanning micrograph showing the surface of a structure including a sapphire substrate on which a buffer layer, a decomposition layer, and a bridging portion are formed in experiment A.
Figure 19:
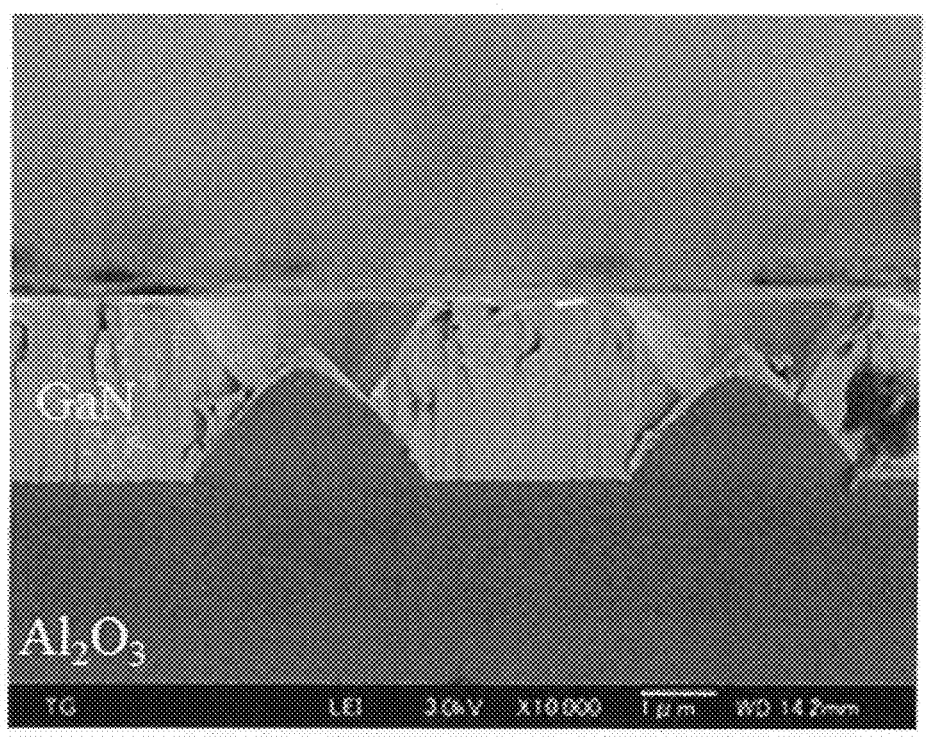
FIG. 19 is a cross-sectional view taken along line XIX-XIX of FIG. 18.

1-2. Decomposition Layer
FIG. 18 is a scanning micrograph showing the surface of a structure including a sapphire substrate on which a buffer layer, a decomposition layer, and a bridging portion are formed. FIG. 19 is a cross-sectional view taken along line XIX-XIX of FIG. 18. The decomposition layer was formed from GaN. The bridging portion was formed from AlN through sputtering. The sputtering time was 50 seconds. The AlN bridging portion has a thickness of 14.3 nm. Cracks caused by lattice constant difference between AlN and GaN were not observed.

Figure 20:
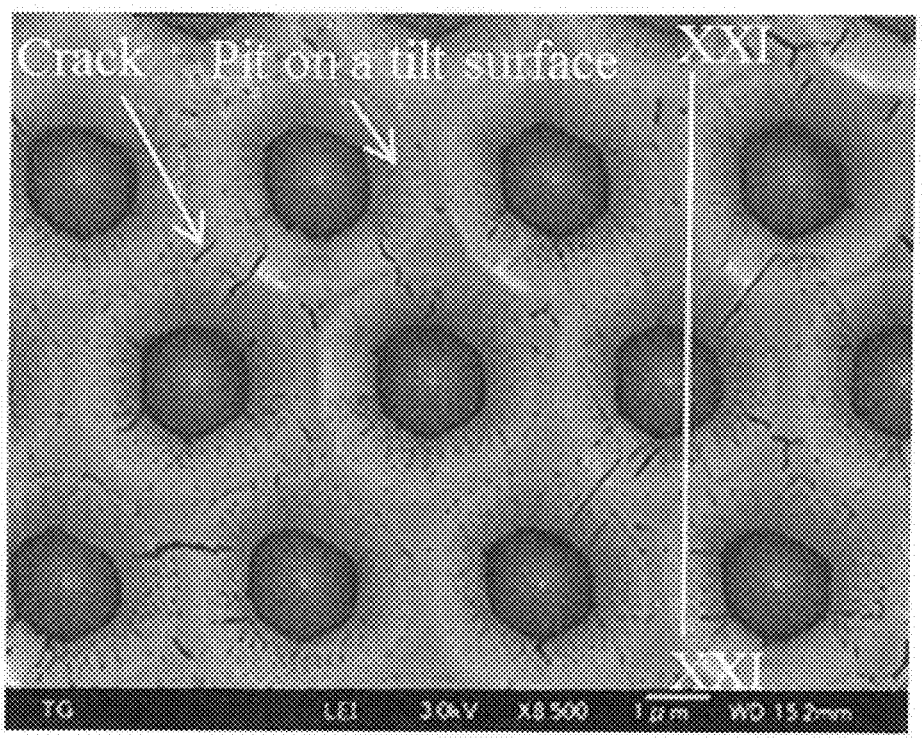
FIG. 20 is a scanning micrograph showing the surface of, for example, the bridging portion after etching of the decomposition layer in experiment A.

1-3. Etching of Decomposition Layer
FIG. 20 is a scanning micrograph showing the surface of, for example, the bridging portion after etching of the decomposition layer. As shown in FIG. 20, the density of through holes in the leg portion C10a of the bridging portion C10 is higher than the density of through holes in the top portion C10b of the bridging portion C10. Thus, the through holes caused by the threading dislocations are concentrated in the leg portion C10a of the bridging portion C10.

As shown in FIG. 20, cracks are generated partially in the bridging portion C10. Cracks are probably generated during etching or cooling. Thus, cracks are less likely to be generated if the etching and film formation processes are continuously performed. Since the bridging portion C10 is stable as a whole, the semiconductor layer above the bridging portion C10 can be grown without causing any problem.

Figure 21:
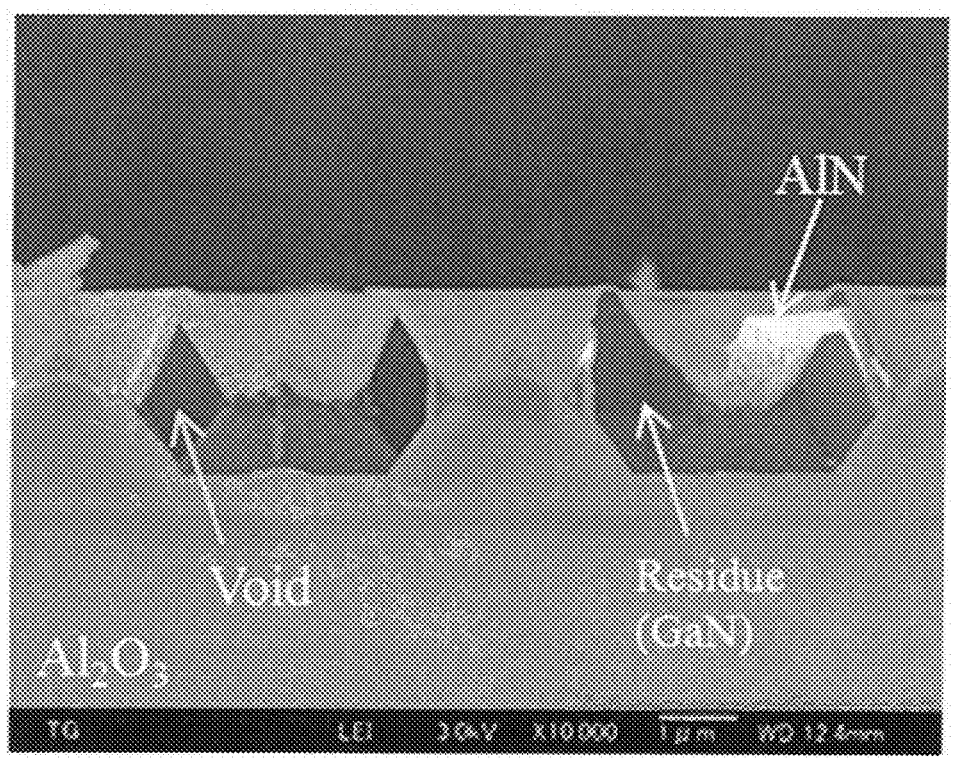
FIG. 21 is a cross-sectional view taken along line XXI-XXI of FIG. 20.

FIG. 21 is a cross-sectional view taken along line XXI-XXI of FIG. 20. As shown in FIG. 21, voids are observed on the left side, and a residue of the GaN decomposition layer is observed on the right side.

1-4. Position of Through Hole
As shown in FIG. 20, the through holes are concentrated in the leg portion C10a of the bridging portion C10. The semiconductor layer above the bridging portion C10 is grown from the top portion C10b of the bridging portion C10. Accordingly, the semiconductor layer above the bridging portion C10 exhibits a relatively low threading dislocation density. Thus, the semiconductor layer above the bridging portion C10 exhibits excellent crystallinity.

2. Experiment B
2-1. Formation of Layers (Including Decomposition Layer)
The same uneven substrate as in experiment A was used in experiment B. A GaN layer (decomposition layer) was formed through MOCVD. An AlGaN layer (bridging portion) was formed through MOCVD. The Al content of the AlGaN layer was 35%. The thickness of the AlGaN layer was 25.8 nm.

Figure 22:
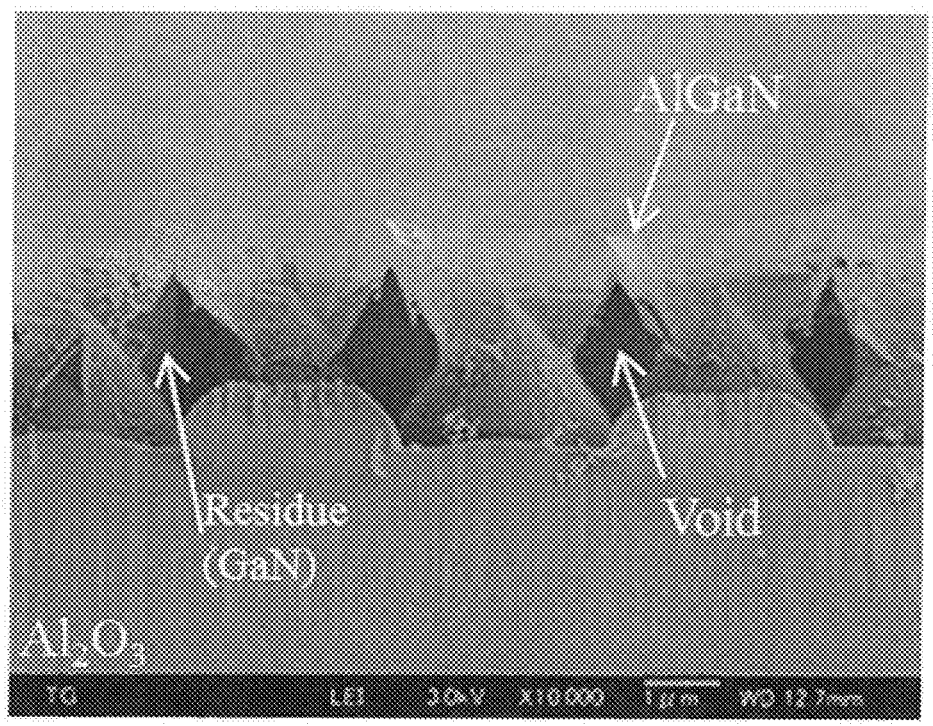
FIG. 22 is a scanning micrograph showing a cross section in the case of formation of an AlGaN layer for a bridging portion in experiment B.

2-1. Etching of Decomposition Layer
FIG. 22 is a scanning micrograph showing a cross section in the case of formation of an AlGaN layer for a bridging portion. Even if the bridging portion is formed of an AlGaN layer, voids can be provided. In the case where the decomposition layer was formed of a GaN layer, the bridging portion was able to be formed of an AlGaN layer having an Al content of 5% to 35%.

In the case where the bridging portion is formed of an AlGaN layer, the composition of the bridging portion is similar to that of the decomposition layer when the Al content of the AlGaN layer is low. In such a case, the difference in lattice constant is reduced between the bridging portion and the decomposition layer. Thus, generation of cracks can be prevented. However, in such a case, the thermal decomposition temperature of the bridging portion is approximate to that of the decomposition layer. Thus, the bridging portion may undergo damage during thermal decomposition of the decomposition layer. Meanwhile, the composition of the bridging portion differs from that of the decomposition layer when the Al content of the AlGaN layer is high. In such a case, the bridging portion can be prevented from undergoing damage during thermal decomposition of the decomposition layer, but cracks are likely to be generated.

3. Experiment C
3-1. Formation of Layers (Including Bridging Portion)

The same uneven substrate as in experiment A was used in experiment C. A GaN layer (decomposition layer) was formed through MOCVD. A low-temperature AlN layer (bridging portion) was formed through MOCVD. The thickness of the low-temperature AlN layer was 25.8 nm. The formation temperature of the low-temperature AlN layer was within a temperature range of 300° C. to 700° C.

3-2. Etching of Decomposition Layer

Figure 23:
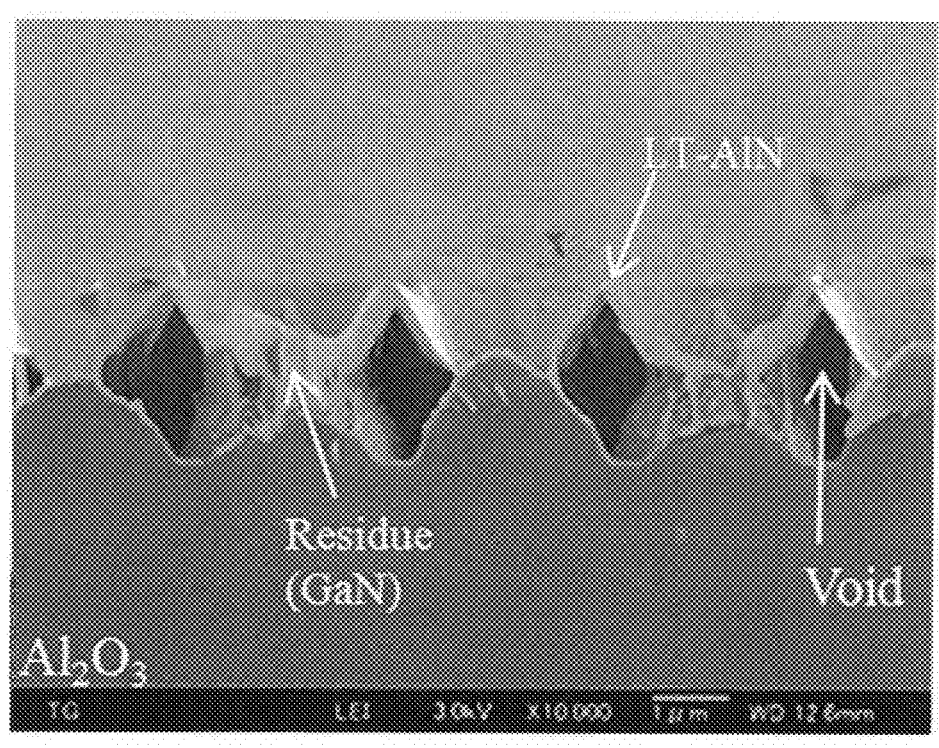
FIG. 23 is a scanning micrograph showing a cross section in the case of formation of a low-temperature AlN layer for a bridging portion in experiment C.

FIG. 23 is a scanning micrograph showing a cross section in the case of formation of a low-temperature AlN layer for a bridging portion. Even if the bridging portion is formed of a low-temperature AlN layer, voids can be provided.

4. Experiment D
4-1. Substrate

A substrate having a stripe-pattern unevenly shaped portion was used. A GaN layer having non-polar m-plane (decomposition layer) was formed through MOCVD, and an AlGaN layer (bridging portion) was formed through MOCVD. The Al composition of the AlGaN layer was 15%.

4-2. Etching of Decomposition Layer

Figure 24:
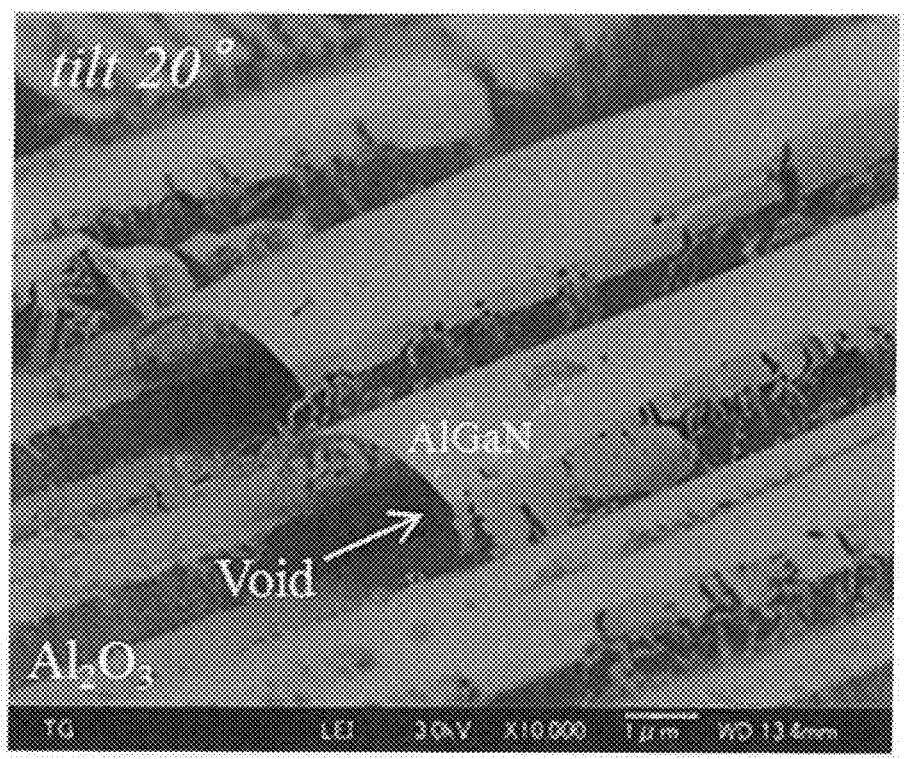
FIG. 24 is a scanning micrograph showing a region around a bridging portion after etching of a decomposition layer in experiment D.
Figure 25:
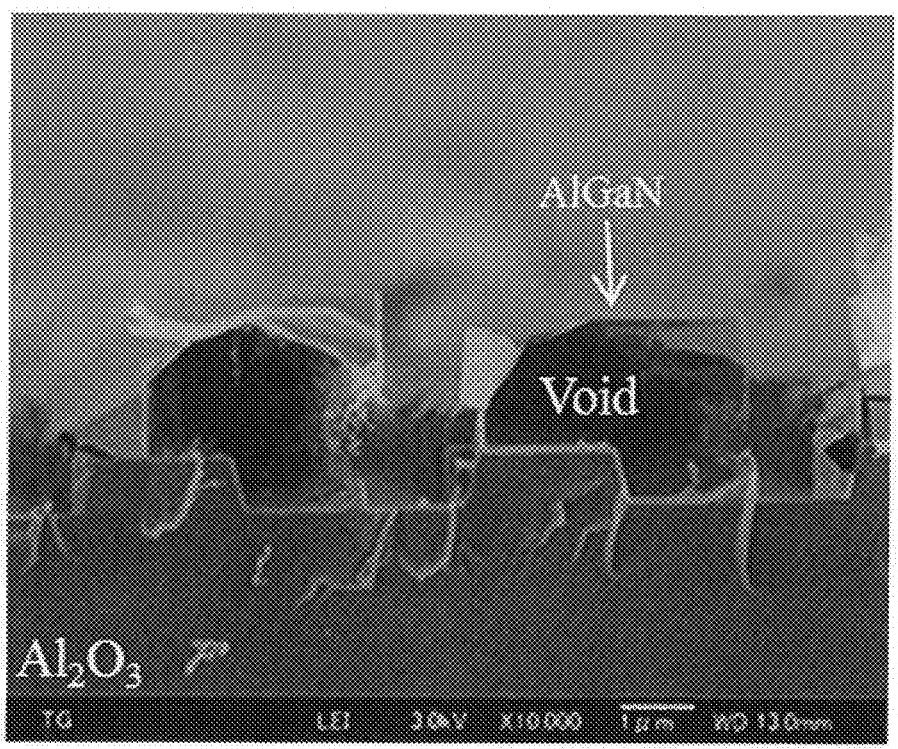
FIG. 25 is a scanning micrograph showing a cross section around the bridging portion after etching of the decomposition layer in experiment D.

FIG. 24 is a scanning micrograph showing a region around the bridging portion after etching of the decomposition layer. FIG. 25 is a scanning micrograph showing a cross section around the bridging portion after etching of the decomposition layer. As shown in FIGS. 24 and 25, voids are observed between the substrate and the AlGaN layer.

5. Experiment E
5-1. Thickness of Bridging Portion

Suitable voids were provided in the case where the thickness of the bridging portion C10 was about 8 nm to about 60 nm.

What is claimed is:

1. A semiconductor structure comprising:
   a substrate;
   a bridging portion bridged to the substrate;
   a semiconductor layer formed on the bridging portion; and
   a first void defined by the substrate and the bridging portion;
   wherein the bridging portion comprises a plurality of through holes; and
   the semiconductor layer does not comprise a through hole.

2. The semiconductor structure according to claim 1, wherein some of the through holes are blocked with the semiconductor layer.

3. The semiconductor structure according to claim 1, wherein the bridging portion comprises a leg portion and a top portion;
   at least a part of the leg portion is not in contact with the semiconductor layer;
   the top portion is in direct contact with the semiconductor layer;
   the leg portion comprises one or more first through hole comprising a first opening and a second opening;
   the top portion comprises one or more second through hole;
   the first opening of the first through hole is open toward the first void;
   the second opening of the first through hole is open without being blocked with the semiconductor layer; and
   the second through hole is blocked with the semiconductor layer.

4. The semiconductor structure according to claim 3, wherein a second void is defined at least by the semiconductor layer and the leg portion of the bridging portion; and
   the second opening of the first through hole is open toward the second void.

5. The semiconductor structure according to claim 3, wherein the density of the first through holes in the leg portion is higher than the density of the second through holes in the top portion.

6. The semiconductor structure according to claim 3, wherein the total area of the surface in contact with the semiconductor layer in the top portion of the bridging portion is smaller than a half of the area of the surface of the substrate on which the bridging portions are bridged.

7. The semiconductor structure according to claim 3, wherein a thickness of the top portion of the bridging portion is greater than that of the leg portion of the bridging portion.

8. The semiconductor structure according to claim 1, wherein the substrate has an unevenly shaped portion having a bottom portion and a plurality of protrusions.

9. The semiconductor structure according to claim 8, wherein the distance between the top of the bridging portion and the bottom portion of the substrate is greater than the distance between the tops of the protrusions of the substrate and the bottom portion of the substrate.

10. The semiconductor structure according to claim 8, wherein each of the protrusions of the substrate has a side face; and
    the bridging portion is supported by the side face of the substrate.

11. The semiconductor structure according to claim 8, wherein the protrusions of the substrate have a side portion and a top portion; and
    the bridging portion is bridged over from the bottom portion to the top portion of the substrate.

12. The semiconductor structure according to claim 1, wherein the substrate comprises a flat first surface;
    a mask layer is formed on a part of the first surface of the substrate; and
    the bridging portion is formed so as to be in contact with the mask layer.

13. The semiconductor structure according to claim 1, wherein the substrate comprises a flat main surface; and
    the bridging portion is supported by the main surface of the substrate.

14. The semiconductor structure according to claim 1, wherein the bridging portion is formed from an Al-containing Group III nitride.

15. The semiconductor structure according to claim 1, wherein a residue containing GaN or InGaN remains at least a portion in the first void.

16. The semiconductor structure according to claim 1, wherein at least one crack is formed in the bridging portion.

17. The semiconductor structure according to claim 1, wherein the bridging portion comprises a facet plane on the surface thereof.

18. A semiconductor device comprising:
    a substrate;
    a bridging portion bridged to the substrate;
    a plurality of semiconductor layers formed on the bridging portion;
    one or more electrodes that are conducted to at least one of the semiconductor layers; and
    a first void defined by the substrate and the bridging portion;
    wherein the bridging portion comprises a plurality of through holes; and the semiconductor layer does not comprise a through hole.

19. The semiconductor device according claim 18, wherein the semiconductor layer comprises a first semiconductor layer of a first conductive type, a light-emitting layer on the first semiconductor layer, and a second semiconductor layer of a second conductive type on the light-emitting layer.

20. The semiconductor device according claim 18, wherein the semiconductor layer comprises a carrier supply layer that supplies carriers, a carrier traveling layer that the carriers supplied from the carrier supply layer travel.

* * * * *